United States Patent
Fujibayashi et al.

(10) Patent No.: US 8,907,204 B2
(45) Date of Patent: Dec. 9, 2014

(54) THIN FILM PHOTOELECTRIC CONVERSION DEVICE AND METHOD FOR MANUFACTURING THE SAME

(75) Inventors: Takashi Fujibayashi, Otsu (JP); Toshiaki Sasaki, Otsu (JP); Yuko Tawada, Otsu (JP)

(73) Assignee: Kaneka Corporation, Osaka (JP)

( * ) Notice: Subject to any disclaimer, the term of this patent is extended or adjusted under 35 U.S.C. 154(b) by 937 days.

(21) Appl. No.: 12/993,464

(22) PCT Filed: May 19, 2009

(86) PCT No.: PCT/JP2009/059164
§ 371 (c)(1),
(2), (4) Date: Nov. 18, 2010

(87) PCT Pub. No.: WO2009/142187
PCT Pub. Date: Nov. 26, 2009

(65) Prior Publication Data
US 2011/0061715 A1   Mar. 17, 2011

(30) Foreign Application Priority Data
May 22, 2008  (JP) .................................. 2008-134458

(51) Int. Cl.
*H01L 31/0352* (2006.01)
(Continued)

(52) U.S. Cl.
CPC .... *H01L 31/035281* (2013.01); *H01L 31/0352* (2013.01); *C23C 16/407* (2013.01);
(Continued)

(58) Field of Classification Search
None
See application file for complete search history.

(56) References Cited

U.S. PATENT DOCUMENTS 5,886,353 A * 3/1999 Spivey et al. ............ 250/370.09
6,884,478 B2 * 4/2005 Alivisatos et al. ............. 428/1.1
(Continued)

FOREIGN PATENT DOCUMENTS

JP   61116826 A   6/1986
JP   3036278 A   2/1991
(Continued)

OTHER PUBLICATIONS

ISA The International Bureau of WIPO, International Preliminary Report on Patentability for International Application No. PCT/JP2009/059164, Jan. 20, 2011, 6 pages.
(Continued)

*Primary Examiner* — Jennifer Michener
*Assistant Examiner* — Christopher Danicic
(74) *Attorney, Agent, or Firm* — Alleman Hall McCoy Russell & Tuttle LLP

(57) ABSTRACT

Provided is a thin film photoelectric conversion device with maximized output characteristic, which is achieved by improving an uneven current value of a photoelectric conversion cell caused by an uneven film thickness and an uneven film quality of a photoelectric conversion semiconductor layer, which may be generated in scaling up an integrated-type thin film photoelectric conversion device. The thin film photoelectric conversion device includes: a substrate, a transparent electrode layer, a photoelectric conversion unit, and a back electrode layer. An increasing rate $\Delta Zt$ of the film thickness $Zt$ of the transparent electrode layer along X and an increasing rate $\Delta Zs$ of the film thickness $Zs$ of the photoelectric conversion unit along X have different signs, wherein one line segment in a parallel direction to a main surface of the substrate is taken as X".

11 Claims, 12 Drawing Sheets

(51) Int. Cl.
　　　*H01L 31/076*　　(2012.01)
　　　*H01L 31/075*　　(2012.01)
　　　*C23C 16/46*　　(2006.01)
　　　*C23C 16/40*　　(2006.01)
　　　*H01L 31/0224*　　(2006.01)
　　　*H01L 31/0392*　　(2006.01)
　　　*H01L 31/18*　　(2006.01)

(52) U.S. Cl.
　　　CPC ....... *C23C 16/46* (2013.01); *H01L 31/022466* (2013.01); *H01L 31/03921* (2013.01); *H01L 31/075* (2013.01); *H01L 31/076* (2013.01); *H01L 31/1804* (2013.01); *H01L 31/1884* (2013.01); *Y02E 10/548* (2013.01); *Y02E 10/547* (2013.01)
　　　USPC ........................................................ 136/252

(56)　　　　References Cited

U.S. PATENT DOCUMENTS

2003/0000565 A1* 1/2003 Hayashi et al. ............... 136/244
2007/0111368 A1* 5/2007 Zhang et al. ..................... 438/99
2007/0212510 A1* 9/2007 Hieslmair et al. ............ 428/40.1
2008/0264478 A1* 10/2008 Ahn et al. ....................... 136/255

FOREIGN PATENT DOCUMENTS

| JP | 6204138 A | 7/1994 |
| JP | 9107115 A | 4/1997 |
| JP | 11087749 A | 3/1999 |
| JP | 11238895 A | 8/1999 |
| JP | 2000208787 A | 7/2000 |
| JP | 2002-076381 A | 3/2002 |
| JP | 2005-045129 A | 2/2005 |
| JP | 2008-300872 A | 12/2008 |

OTHER PUBLICATIONS

ISA Japanese Patent Office, International Search Report of PCT/JP2009/059164, Jun. 30, 2009, 2 pages.

* cited by examiner

THIN FILM PHOTOELECTRIC CONVERSION DEVICE AND METHOD FOR MANUFACTURING THE SAME

TECHNICAL FIELD

The present invention relates to a thin film photoelectric conversion device.

BACKGROUND ART

In recent years, among photoelectric conversion devices, a thin film photoelectric conversion device that needs fewer raw materials has attracted attention and its development has been vigorously made in order to achieve both lower cost and higher efficiency of photoelectric conversion devices including solar cells. In particular, a method for forming a satisfactory semiconductor layer on a low-priced substrate such as glass by means of a low-temperature process has been expected as a method capable of realizing low cost.

Generally, in forming a superstrate-type thin film photoelectric conversion device, it is essential that a transparent electrode layer be provided in a part of the conversion device. The thin film photoelectric conversion device includes one or more photoelectric conversion units between the transparent electrode layer and a back electrode layer. Light is made incident from the transparent electrode layer side.

The transparent electrode layer is, for example, formed using a transparent conductive oxide such as tin oxide ($SnO_2$) or oxide zinc (ZnO) by methods such as a chemical vapor deposition (CVD) method, sputtering method or vacuum deposition. It is desirable that the transparent electrode layer for use in the thin film photoelectric conversion device has fine irregularities on its surface so as to have the effect of increasing scattering of incident light. This is because, although a thickness of a photoelectric conversion layer in the thin film photoelectric conversion device can be made small as compared with that in a conventional photoelectric conversion device using bulk monocrystalline or polycrystalline silicon, the thin film photoelectric conversion device has a problem of light absorption of the entire thin film being limited by the film thickness. Thereat, in order to effectively use light incident on the photoelectric conversion unit including the photoelectric conversion layer, a method has been devised in which the surface of the transparent electrode layer or the metal layer in contact with the photoelectric conversion unit is roughened (textured), light is scattered on its interface, and then made incident into the photoelectric conversion unit, to extend an optical path length for increasing a light absorption amount inside the photoelectric conversion layer. This technique is referred to as "light confinement", and has been an important element technique in putting the thin film photoelectric conversion device with high photoelectric conversion efficiency to practical use.

The photoelectric conversion unit is made up of a semiconductor layer of pn junction or pin junction. In the case of using the pin junction in the photoelectric conversion unit, the junction is formed by stacking a p-type layer, an i-type layer and an n-type layer in this order or in a reversed order thereof, and one whose i-type photoelectric conversion layer occupying its main part is amorphous is referred to as an amorphous photoelectric conversion unit, and one whose i-type layer is crystalline is referred to as a crystalline photoelectric conversion unit. For the semiconductor layer, there is used amorphous silicon or thin film crystalline silicone as a silicon-based thin film semiconductor, or $CuInSe_2$ (abbreviated as CIS), CdTe or the like as a compound semiconductor.

In the silicon-based thin film photoelectric conversion device as an example of the thin film photoelectric conversion device, the pin junction is used for the photoelectric conversion unit, the junction being made up of the p-type layer, the i-type layer as a substantially intrinsic photoelectric conversion layer, and the n-type layer. Among them, one using the amorphous silicon for the i-type layer is referred to as an amorphous silicon photoelectric conversion unit, and one using silicon containing a crystalline material for the i-type layer is referred to as a crystalline silicon photoelectric conversion unit. It is to be noted that, as for an amorphous or crystalline silicon-based material, there is not only a case where silicon is used alone as a main element constituting the semiconductor, but there can also be used an alloy material containing an element such as carbon, oxygen, nitrogen or germanium. Further, as a main constitutional material for the conductivity-type layer, one homogeneous to the i-type layer does not necessarily need to be used, but for example, amorphous silicon carbide may be used for the p-type layer of the amorphous silicon photoelectric conversion unit, and a silicon layer containing a crystalline material (also referred to as microcrystalline silicon) may also be used for the n-type layer.

As the back electrode layer formed on the photoelectric conversion unit, for example, a metal layer such as a layer made of at least one or more metals selected from Ti, Cr, Al, Ag, Au, Cu and Pt, or made of an alloy of these metals, is formed by a sputtering method, vacuum deposition method, or the like. Further, there may be formed a layer made of a transparent conductive oxide such as indium tin oxide (ITO), $SnO_2$ or ZnO between the photoelectric conversion unit and the metal electrode.

As a method for improving conversion efficiency of the thin film photoelectric conversion device, there has been known a thin film photoelectric conversion device adopting a structure referred to as a stacked type (tandem type) in which two or more photoelectric conversion units are stacked. In this method, a front photoelectric conversion unit including a photoelectric conversion layer with a large optical band gap on the light incident side of the thin film photoelectric conversion device is arranged, and therebehind a back photoelectric conversion unit including a photoelectric conversion layer with a small band gap is sequentially arranged, to allow photoelectric conversion over a broad wavelength range of incident light, whereby incident light is effectively used so as to improve conversion efficiency as the entire conversion device. Among the stacked-type thin film photoelectric conversion device, one stacked with the amorphous photoelectric conversion unit and the crystalline photoelectric conversion unit is referred to as a hybrid-type thin film photoelectric conversion device. (In the present application, the photoelectric conversion unit arranged relatively on the light incident side is referred to as the front photoelectric conversion unit, and the photoelectric conversion unit adjacently arranged on the side farther than the front photoelectric conversion unit from the light incident side is referred to as the back photoelectric conversion unit).

In the case of manufacturing such a thin film photoelectric conversion device as a large-area thin film photoelectric conversion device capable of producing a high output at a high voltage as electric power, it is not that a plurality of thin film photoelectric conversion devices formed on a substrate are connected in series by wiring and then used, but generally, for obtaining good yields, a thin film solar cell formed on a large substrate is divided into a plurality of cells and those cells are connected in series by patterning so as to be integrated. In particular, in the thin film photoelectric conversion device using a glass plate as a substrate and making light incident from the glass substrate side, each cell is generally connected in series in a direction perpendicular to a longitudinal direction of the strip shape so as to be integrated thereby reducing a loss due to resistance of the transparent electrode layer on the glass substrate, wherein the integration is achieved by forming separation grooves by laser scribing which process the transparent electrode layer in strip shape with a predetermined width.

An integrated-type thin film photoelectric conversion device is generally produced by such a method as below. First, on a transparent substrate, a transparent electrode layer made of a transparent conductive oxide such as $SnO_2$ or ZnO is formed, and the transparent electrode layer is subjected to scribing with a laser or the like. Next, a photoelectric conversion layer made of amorphous or crystalline silicon, or the like, is formed on the transparent electrode layer by a plasma enhanced CVD method, and thereafter, the photoelectric conversion layer is subjected to scribing with the laser or the like. A scribe line formed in the photoelectric conversion layer by this separation groove is used as a connection line for connecting a back electrode layer and the transparent electrode layer between two mutually adjacent cells. Subsequently, the back electrode layer made of a light reflective metal is formed on the photoelectric conversion layer by a vacuum deposition method, sputtering method or the like.

In such an integrated-type thin film photoelectric conversion device, the larger current and output power are desirably obtained. While, at the time of producing the conversion device by scaling up its area for cost reduction, what is important has been how current values generated in a plane can be made uniform and maximal by improving uniformity of a film thickness and film quality of each layer constituting the conversion device. The present invention provides a thin film photoelectric conversion device that improves nonuniformity of current values of photoelectric conversion cells caused by nonuniformity of a film thickness and film quality of a photoelectric conversion semiconductor layer, which occurs at the time of scaling up an integrated-type thin film photoelectric conversion device, to maximize output characteristics thereof.

For example, in Patent Document 1, a film thickness distribution of the photoelectric conversion layer formed by a plasma enhanced CVD method is caused by a gas flow rate distribution and an electric field distribution inside the device, and consequently, a current value in a portion with a larger film thickness is larger, and a current value in a portion with a smaller film thickness is smaller. As a technique for solving such in-plane nonuniformity of current values of photoelectric conversion cells, there has been disclosed a technique where a width of each string of the photoelectric conversion cells which was formed by laser scribing is adjusted to set constant current values that are generated, so as to improve output characteristics of the thin film photoelectric conversion device.

PRIOR ART DOCUMENT

Patent Document

Patent Document 1: Japanese Patent Laid-Open Publication No. 2002-76381

SUMMARY OF THE INVENTION

Problems to be Solved by the Invention

As described in Patent Document 1, in formation of the photoelectric conversion unit constituting the integrated-type thin film photoelectric conversion device, a plasma enhanced CVD method capable of making its area large and its cost low is often used. A film thickness of the photoelectric conversion layer formed by this method often has a distribution based upon film-forming positions inside a plasma enhanced CVD device. For example, when a reaction gas is supplied inside the plasma enhanced CVD device from the central portion to the substrate, a film thickness of a photoelectric conversion layer grown in a position close to a reaction gas supply portion (central portion of the substrate) tends to be larger, whereas a film thickness of a photoelectric conversion layer grown in a position far from the reaction gas supply portion (peripheral portion of the substrate) tends to be smaller.

When the film thickness distribution of the photoelectric conversion layer is generated, a current value generated in the photoelectric conversion layer with a smaller film thickness is smaller than a current value generated in a portion with a larger film thickness. Consequently, in the case of the integrated-type thin film photoelectric conversion device, the current value generated in each serially connected solar cell is not constant, and there occurs a problem in that a serially structured photoelectric conversion device is limited by a small current value and thus is unable to obtain sufficient output characteristics as a whole.

The present invention was made in view of the above problem, and a main object of the invention is to provide a substrate for a thin film photoelectric conversion device which is capable of improving output characteristics of the thin film photoelectric conversion device with larger area.

Means for Solving the Problems

The first aspect of the invention is "a thin film photoelectric conversion device, including a substrate, a transparent electrode layer, a photoelectric conversion unit, and a back electrode layer, wherein, respective signs are different between an increasing rate $\Delta Zt$ along X of a film thickness $Zt$ of the transparent electrode layer and an increasing rate $\Delta Zs$ along X of a film thickness $Zs$ of the photoelectric conversion unit, whereas one line segment in a parallel direction to a main surface of the substrate is taken as X".

Also, the invention is "the thin film photoelectric conversion device, characterized in that the film thickness $Zt$ of the transparent electrode layer is large at a peripheral portion of the substrate as compared with a central portion thereof and the film thickness $Zs$ of the photoelectric conversion unit is small at the peripheral portion of the substrate as compared with the central portion thereof, or one characterized in that the film thickness $Zt$ of the transparent electrode layer is small at the peripheral portion of the substrate as compared with the central portion thereof and the film thickness $Zs$ of the photoelectric conversion unit is large at the peripheral portion of the substrate as compared with the central portion thereof".

Also, the invention is "the thin film photoelectric conversion device, wherein the substrate is rectangular, a film thickness $Zta$ of the transparent electrode layer near at least one corner 'a' of the substrate is larger than a film thickness $Ztb$ of the transparent electrode layer near any other corner 'b' of the substrate, and a film thickness $Zsa$ of the photoelectric conversion unit near the corner 'a' is smaller than a film thickness $Zsb$ of the photoelectric conversion unit near the corner 'b'".

Also, the invention is "the thin film photoelectric conversion device, wherein a distribution of the film thickness of the transparent electrode layer and a distribution of the film thickness of the photoelectric conversion unit have an opposite thickness-distribution relation".

Also, the invention is "the thin film photoelectric conversion device, wherein a central portion of a film formation surface has a smaller thickness and a peripheral portion of the film formation surface has a larger thickness in the transparent electrode layer, and a central portion of a film formation surface has a larger thickness and a peripheral portion of the film formation surface has a smaller thickness in the photoelectric conversion unit".

Also, the invention is "the thin film photoelectric conversion device, wherein the photoelectric conversion unit is one or more selected from the group consisting of at least one amorphous photoelectric conversion unit, at least one crystalline photoelectric conversion unit, and a photoelectric conversion unit including both at least one amorphous photoelectric conversion unit and at least one crystalline photoelectric conversion unit".

Also, the invention is "the thin film photoelectric conversion device, wherein the transparent electrode layer, the photoelectric conversion unit layer and the back electrode layer are divided by a plurality of separation grooves so as to form a plurality of photoelectric conversion cells, and the plurality of photoelectric conversion cells are electrically connected in series with one another through a plurality of connection grooves".

Also, the invention is "the thin film photoelectric conversion device, wherein a direction in which the plurality of photoelectric conversion cells are connected in series is made substantially the same as a direction of the line segment X".

Also, the invention is "the thin film photoelectric conversion device, wherein an area of the substrate is not smaller than 900 cm$^2$".

Also, the invention is "a method for manufacturing the thin film photoelectric conversion device, at least including a step of separately forming a transparent electrode layer and a photoelectric conversion unit so that a film thickness distribution of the transparent electrode layer and a film thickness distribution of the photoelectric conversion unit have an opposite thickness-distribution relation to each other".

Also, the invention is "a method for manufacturing the thin film photoelectric conversion device, including at least one or more selected from the group consisting of: a step of forming on a substrate a transparent electrode layer having a large film thickness at a peripheral portion as compared with a film thickness at a central portion, and a step of forming on the transparent electrode layer a photoelectric conversion unit having a small film thickness at a peripheral portion as compared with a film thickness at a central portion; a step of forming on the substrate a transparent electrode layer having a small film thickness at a peripheral portion as compared with a film thickness at a central portion, and a step of forming on the transparent electrode layer a photoelectric conversion unit having a large film thickness at a peripheral portion as compared with a film thickness at a central portion; a step of forming on the substrate a photoelectric conversion unit having a large film thickness at a peripheral portion as compared with a film thickness at a central portion, and a step of forming on the photoelectric conversion unit a transparent electrode layer having a small film thickness at a peripheral portion as compared with a film thickness at a central portion; and a step of forming on the substrate a photoelectric conversion unit having a small film thickness at a peripheral portion as compared with a film thickness at a central portion, and a step of forming on the photoelectric conversion unit a transparent electrode layer having a large film thickness at a peripheral portion as compared with a film thickness at a central portion".

Also, the invention is "a method for manufacturing the thin film photoelectric conversion device, wherein a main surface of the substrate has a rectangular shape, and wherein the method includes at least one or more selected from the group consisting of: a step of forming a transparent electrode layer having a larger film thickness near one corner 'a' of the substrate than a film thickness near any other corner 'b' of the substrate, and a step of forming a photoelectric conversion unit having a smaller film thickness near the corner 'a' than a film thickness near the corner 'b'; a step of forming a transparent electrode layer having a smaller film thickness near one corner 'a' of the substrate than a film thickness near any other corner 'b' of the substrate, and a step of forming a photoelectric conversion unit having a larger film thickness near the corner 'a' than a film thickness near the corner 'b'; a step of forming a photoelectric conversion unit having a larger film thickness near one corner 'a' of the substrate than a film thickness near any other corner 'b' of the substrate, and a step of forming a transparent electrode layer having a smaller film thickness near the corner 'a' than a film thickness near the corner 'b'; and a step of forming a photoelectric conversion unit having a smaller film thickness near one corner 'a' of the substrate than a film thickness near any other corner 'b' of the substrate, and a step of forming a transparent electrode layer having a larger film thickness near the corner 'a' than a film thickness near the corner 'b'".

Also, the invention is "a method for manufacturing the thin film photoelectric conversion device, wherein the transparent electrode layer is zinc oxide formed by a low-pressure thermal CVD method, and, as for temperatures of the substrate in forming the transparent electrode layer, a difference is made between a temperature of the central portion of the substrate and a temperature of the peripheral portion of the substrate".

Effects of the Invention

According to the present invention, in a thin film photoelectric conversion device, by a manufacturing method including a step of forming a transparent electrode layer and a step of forming a photoelectric conversion unit, a film thickness distribution of the transparent electrode layer is formed so as to be opposite to a film thickness distribution of the photoelectric conversion unit. Therefore, a haze ratio distribution is made to the extent of cancelling an influence of a transmittance distribution due to the film thickness distribution of the transparent electrode layer, and consequently, an in-plane distribution is generated in the light confinement effect, to improve a photoelectric characteristic inside the photoelectric conversion unit so as to improve a generation current of the entire thin film photoelectric conversion device. That is, the generation current of the thin film photoelectric conversion device is averaged in the substrate plane, while an entire generation current also increases, to improve conversion efficiency of the thin film photoelectric conversion device. This effect is exerted regardless of the presence or absence of serial connection.

Further, the effect of the present invention more significantly appears in a so-called integrated-type thin film photoelectric conversion device where photoelectric conversion cells are connected in series. That is, a generation current outputted in the integrated-type thin film photoelectric conversion device is limited by a generation current of the photoelectric conversion cell with the minimal generation current. According to the present invention, a current value generated in each of the serially connected photoelectric conversion cells approaches a constant value so that output characteristics can be improved.

That is, according to the present invention, a film thickness distribution of the transparent electrode layer is formed so as to be opposite to a film thickness distribution of the photoelectric conversion unit in the integrated-type thin film photoelectric conversion device, whereby a haze ratio distribution is made, and consequently, an in-plane distribution is generated in the light confinement effect. As a result, a current value generated in each of the connected-in-series solar cells approaches a constant value so that output characteristics can be improved.

EMBODIMENTS OF THE INVENTION

Figure 1:
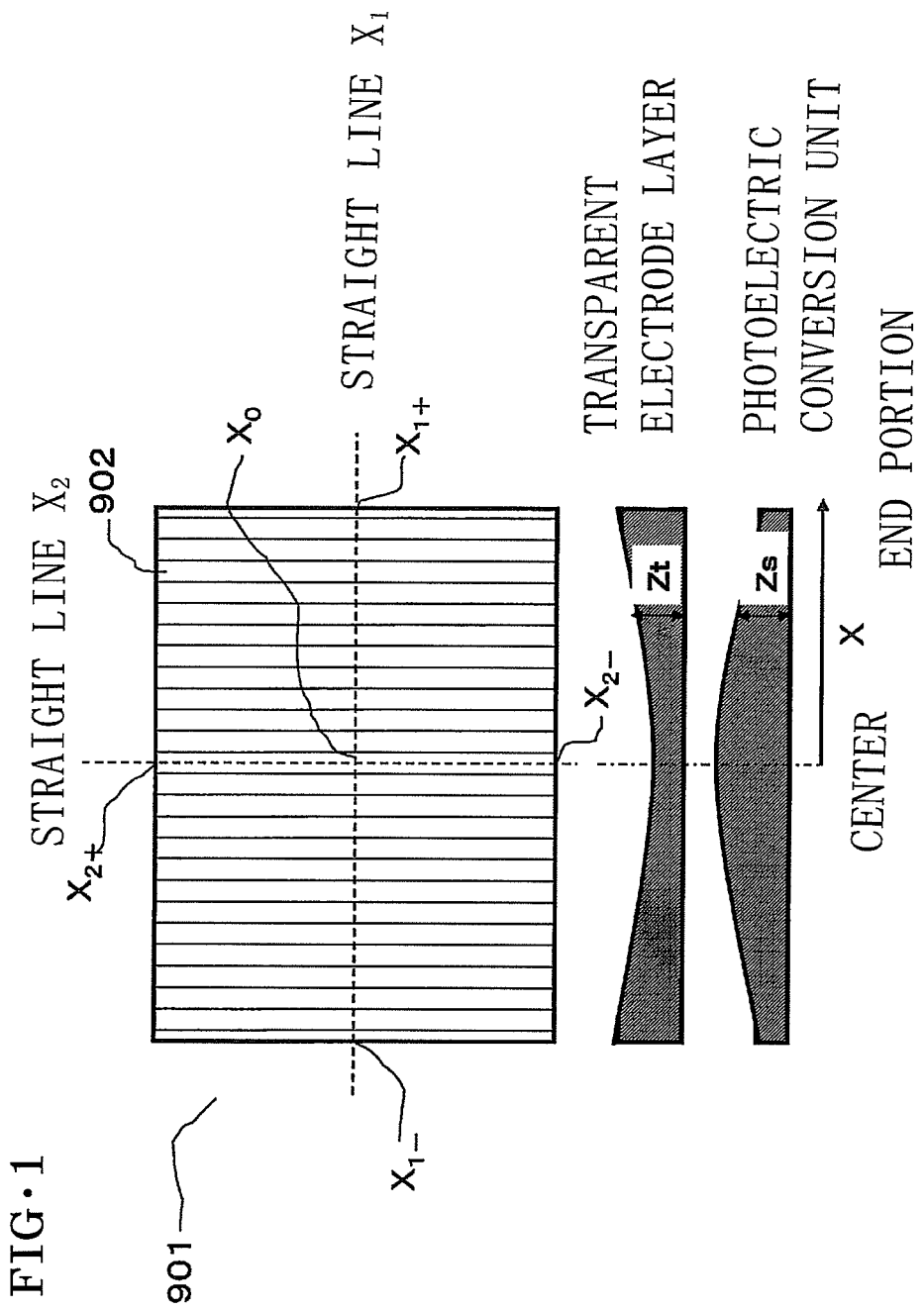
FIG. 1 is a plan view of a thin film photoelectric conversion device as one embodiment of the present invention.

In the specification of the present invention, there are cases where constitutional requirements and the like are described in the form of being provided with reference numerals given in "DESCRIPTIONS OF REFERENCE NUMERALS", the present invention is not constrained to these reference numerals, the drawings and the like which are just exemplifications. In other words, the present invention can be modified in many ways by an ordinary skilled person in the art within a technical idea of the present invention without being constrained to the reference numerals and the like described below.

The present invention solves a problem of a decrease in average generation current, which occurs due to a film thickness distribution of a photoelectric conversion unit generated at the time of scaling up a thin film photoelectric conversion device, and especially improves nonuniformity of current values of photoelectric conversion cells caused by nonuniformity of a film thickness and film quality of a photoelectric conversion unit which occurs at the time of scaling up an integrated-type thin film photoelectric conversion device, to provide a thin film photoelectric conversion device which maximizes output characteristics of an integrated-type thin film photoelectric conversion device.

When an area of the thin film photoelectric conversion device becomes large, it becomes difficult to make the film thickness of the photoelectric conversion unit uniform over a substrate. For example, when a silicon-based thin film photoelectric conversion unit is produced by a plasma enhanced CVD method, a film thickness of the photoelectric conversion unit at the end portion of the substrate is often small as compared with that at the center of the substrate. Especially in the case of the area of the substrate being not smaller than 900 $cm^2$, the film thickness of the photoelectric conversion unit at the end portion tends to be small. A generation current of the thin film photoelectric conversion device decreases as the film thickness of the photoelectric conversion unit becomes smaller. For example, "not smaller than 900 $cm^2$" means an area of 1000 $cm^2$, 1440 $cm^2$ or 2880 $cm^2$ or a larger area, and specifically, the area is more preferably not smaller than 910 mm×455 mm, further preferably not smaller than 1 m square (1000 mm×1000 mm), not smaller than 1.2 m square (1200 mm×1200 mm), not smaller than 1000 mm×1300 mm, not smaller than 1000 mm×1400 mm, and most preferably 1400 mm×1400 mm.

In order to suppress a resistance loss, a large-area thin film photoelectric conversion device normally employs a structure where photoelectric conversion cells divided by laser patterning or the like are connected in series on one substrate, as a so-called integrated-type thin film photoelectric conversion device. A generation current of the integrated-type thin film photoelectric conversion device is limited by a photoelectric conversion cell with the minimal generation current among a plurality of serially connected photoelectric conversion cells. For this reason, when a photoelectric conversion cell with the photoelectric conversion unit having a small film thickness is present in a part of the large-area integrated-type thin film photoelectric conversion device, a problem of a decrease in entire generation current occurs.

As a result of an industrious effort in studying the problem of a decrease in generation current in the large-area thin film photoelectric conversion device, the present inventors found that the problem can be solved by making a transparent electrode layer on a light incident side having an opposite film thickness distribution to the film thickness distribution of the photoelectric conversion unit. It is generally considered that, when the film thickness of the transparent electrode layer is made larger, a light absorption loss of the transparent electrode layer increases and the generation current of the thin film photoelectric conversion device decreases. However, a study was conducted in achieving the invention, to find that irregularities of the transparent electrode layer become larger with an increase in film thickness of the transparent electrode layer, leading to an increased light confinement effect, and a generation current rather increases.

Herein, the "film thickness" in the present invention means a film thickness which is provided in a vertical direction to the main surface of the substrate, and averaged with a size of 30 μm to several mm in a parallel direction to the main surface of the substrate. That is, irregularities with intervals of 10 nm to 1 μm provided on the transparent electrode layer and the like for the purpose of increasing the light confinement effect are not reflected to the "film thickness" in the present invention.

Figure 3:
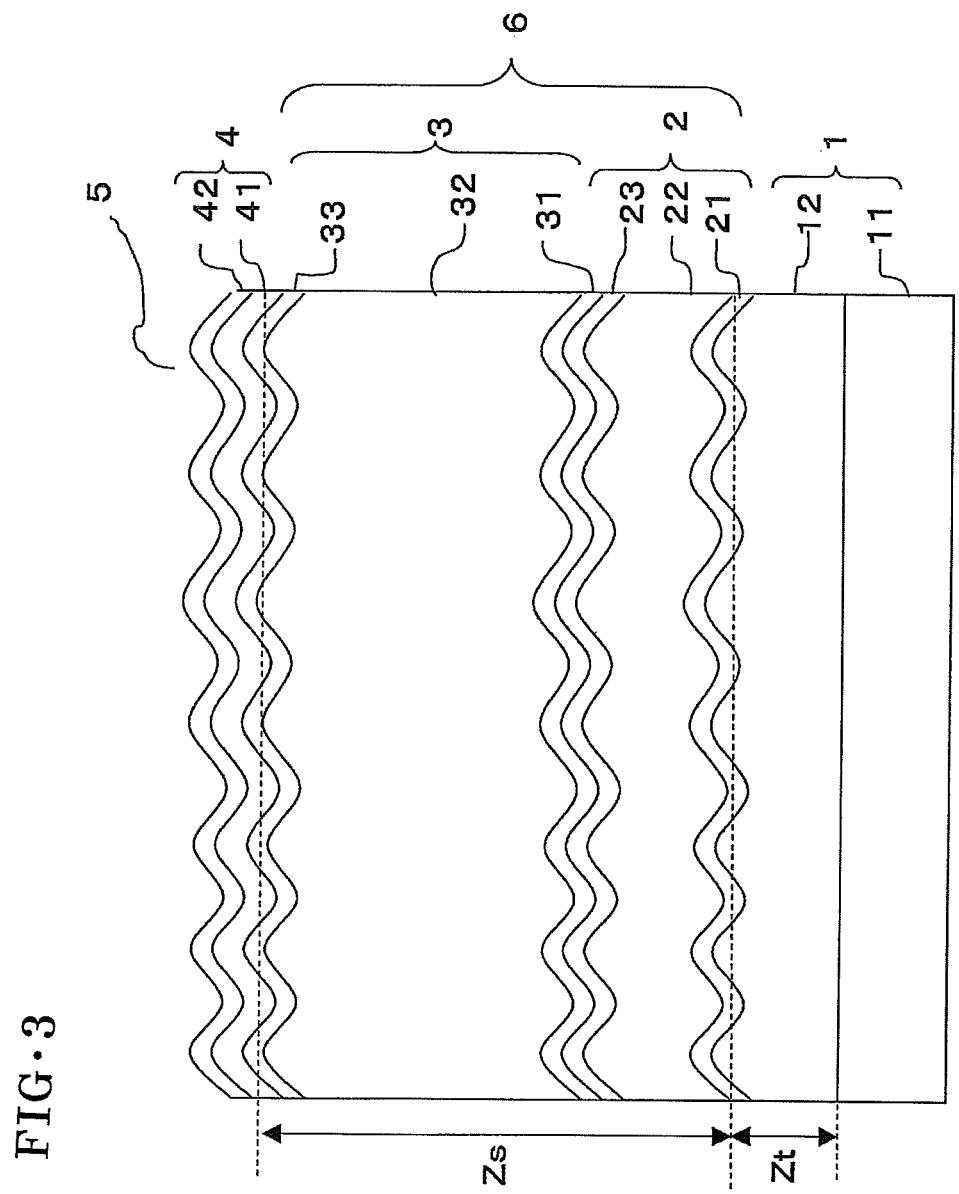
FIG. 3 is a cross-sectional view of a thin film photoelectric conversion device as one embodiment of the present invention.

Further, the "film thickness of the photoelectric conversion unit" in the present invention means a total film thickness of the photoelectric conversion unit included in the thin film photoelectric conversion device. For example, in the case of a thin film photoelectric conversion device including only one photoelectric conversion unit with the pin junction, a total of film thicknesses of a p-type layer, an i-type layer and an n-type layer is the "film thickness of the photoelectric conversion unit". As opposed to this, in the case of a thin film photoelectric conversion device including two photoelectric conversion units as shown in FIG. 3, a total of film thicknesses of a front photoelectric conversion unit and a back photoelectric conversion unit is the "film thickness of the photoelectric conversion unit". Specifically, a film thickness from a p-type layer 21 of a front photoelectric conversion unit 2 to an n-type layer 33 of a back photoelectric conversion unit 3 shown in Zs of FIG. 3 is the film thickness.

It is to be noted that in the case of a two-stacked tandem type photoelectric conversion device having an amorphous photoelectric conversion unit and a crystalline photoelectric conversion unit as one aspect of the present invention, the amorphous photoelectric conversion unit has a smaller film thickness and the crystalline photoelectric conversion unit has a larger film thickness due to the relation of light absorption coefficients and the like between the amorphous silicon and crystalline silicon. Normally, the amorphous silicon layer has a film thickness of the order of 300 to 600 nm, whereas the crystalline silicon layer which requires a long-wavelength light confinement effect has a film thickness of the order of 2000 to 4000 nm.

Hence, in the case of the two-stacked tandem type photoelectric conversion device having the amorphous photoelectric conversion unit and the crystalline photoelectric conversion unit, for controlling "the film thickness of the photoelectric conversion unit", it is more effective to control the film thickness distribution of the crystalline photoelectric conversion unit than to control the film thickness distribution of the amorphous photoelectric conversion unit.

It should be noted that the control of the film thickness distribution of the photoelectric conversion unit is described later.

In addition, the term "pin junction" in the present specification includes both one with a p-type layer, an i-type layer and an n-type layer stacked in this order on the substrate and one with an n-type layer, an i-type layer and a p-type layer stacked in this order. Further, the term "pin junction" in the present specification includes both one whose layer close to the light incident side with respect to the i-type layer is the p-type layer and one whose layer close to the light incident side is the n-type layer.

FIG. 1 shows a plan view of a thin film photoelectric conversion device as an example of an embodiment of the present invention. In the present embodiment configured is a so-called integrated-type thin film photoelectric conversion device where strip-like photoelectric conversion cells 902 are connected in series. In FIG. 1, as examples of a line segment X parallel to the substrate, a straight line $X_1$ passing through a center $X_0$ of the substrate and parallel to longer sides thereof and a straight line $X_2$ passing through the center $X_0$ of the substrate and parallel to shorter sides thereof are indicated with dotted lines. Points at which the straight line $X_1$ intersects with the shorter sides are indicated as $X_{1-}$, $X_{1+}$, and points at which the straight line $X_2$ intersects with the longer sides are indicated as $X_{2-}$, $X_{2+}$. A film thickness distribution along the straight line $X_1$ is also schematically shown. That is, a film thickness distribution in a direction which passes through the center of the substrate and in which the strip-like photoelectric conversion cells are electrically connected in series, is schematically shown. Herein, a length of the defined line segment X is preferably not less than 30%, more preferably not less than 50%, of a shorter side or one side of the substrate, or a diameter (in the case of its shape being close to a circular shape). In the first place, the shape of the substrate is not an essence of the present invention, and the shape of the substrate may be one or more selected from the group consisting of a rectangle, a square, a triangle, a polygon, a circle, an ellipse, and an infinite shape, or may be a combination of those. That is, the shape of the substrate may have any shape.

In the aspect of FIG. 1, a distribution of a film thickness Zt of the transparent electrode layer is smaller at the center and is larger at the end portion. That is, an increasing rate ΔZt along the straight line $X_1$ of the film thickness Zt of the transparent electrode layer is a positive value and its absolute value gradually increases from the center toward the end portion. As opposed to this, a distribution of a film thickness Zs of the photoelectric conversion unit is larger at the center and is smaller at the end portion. That is, an increasing rate ΔZs along the straight line $X_1$ of the film thickness Zs of the photoelectric conversion unit is a negative value and its absolute value gradually increases from the center toward the end portion. Signs of ΔZt and ΔZs are thus different.

Herein, in the present specification, the increasing rate (ΔZ) of the film thickness is used as an evaluation indicator of the film thickness distribution. Specifically, when at least one line segment parallel to the surface of the substrate is taken as X, the film thickness is measured with intervals of 5 mm to 100 mm, and an average rate of changes at that time is defined as the increasing rate (ΔZt) [%/cm] of the film thickness along X. Specifically, the increasing rate is expressed by Expression (1):

$$\Delta Z\ [\%/cm] = (Z_j - Z_i)/Z_i \times 100[\%]/x\ [cm] \qquad \text{Expression (1)}$$

where $Z_i$ is a film thickness at an initial point, $Z_j$ is a film thickness at an end point, and x is a distance between the initial point and the end point. On the substrate with an almost symmetrical film thickness distribution, it is desirable to draw the line segment X from the center to the end portion, and calculate an average increasing rate ΔZ of film thicknesses along X, so as to take the increasing rate ΔZ as an indicator of the film thickness distribution. For example, when the film thickness at the center is 2000 nm and the film thickness at the end portion is 3000 nm in a 1 m square-size substrate with an almost symmetrical film thickness distribution, ΔZ from the center to the end portion is expressed by Expression (2):

$$\Delta Z = (3000 - 2000)/2000 \times 100[\%]/50\ [cm] = 1\ [\%/cm] \qquad \text{Expression (2)}$$

Further, in the present specification, a film thickness deviation (div) is defined by Expression (3):

$$\text{div}\ [\%] = (Zmax - Zmin)/(Zmax + Zmin) \times 100 \qquad \text{Expression (3)}$$

Herein, Zmax is a maximal film thickness, and Zmin is a minimal film thickness. For calculating this film thickness deviation (div), it is desirable to measure film thicknesses at not less than nine points.

Generally, when the film thickness deviation (div) in a 1 m square-size substrate is ±10%, the film thickness distribution can be regarded as uniform. When the film thickness at the end portion is larger by 10% than at the center in a symmetrical film thickness distribution, ΔZ along the line segment X from the center to the end portion is expressed by:

$$\Delta Z = 10[\%]/50\ [cm] = 0.2\ [\%/cm]$$

Therefore in the present specification, when the absolute value of the increasing rate of the film thickness is not more than 0.2%/cm, ΔZ is regarded as nearly equal to zero (ΔZ≈0), and a sign of ΔZ is zero. That is, the sign of ΔZ is positive when ΔZ>0.2%/cm, and the sign of ΔZ is negative when ΔZ<−0.2%/cm. Accordingly, different signs of the increasing rate ΔZt of the transparent electrode layer and the increasing rate ΔZs of the photoelectric conversion unit indicate the following two cases in the present specification:

$$\Delta Zt > 0.2\%/\text{cm, and } \Delta Zs < -0.2\%/\text{cm} \quad (1)$$

$$\Delta Zt < -0.2\%/\text{cm, and } \Delta Zs > 0.2\%/\text{cm} \quad (2)$$

As opposed to this, in a case where the absolute value of either ΔZt or ΔZs is not more than 0.2%/cm, the film thickness distribution is regarded as uniform, and the signs are not referred to as different signs in the present specification.

The film thickness distribution of the photoelectric conversion unit and the film thickness distribution of the transparent electrode layer are formed into opposite shapes, whereby a decrease in generation current in a portion of the photoelectric conversion unit with a smaller film thickness is compensated by the light confinement effect generated by making the film thickness of the transparent electrode layer larger, to suppress partial limitations on the generation current. Consequently, the generation current of the large-area thin film photoelectric conversion device can be made uniform, to improve conversion efficiency.

The film thickness Zs of the photoelectric conversion unit is often smaller at the peripheral portion than at the central portion when produced by a plasma enhanced CVD method, and hence the film thickness Zt of the transparent electrode layer is desirably made larger at the peripheral portion than at the central portion.

Further, at the time of film formation of the photoelectric conversion unit and the transparent electrode layer, in the case of arranging a plurality of substrates on one electrode or one heater or in the case of dividing the substrate into a plurality of numbers after the film formation, the film thickness Zs of the photoelectric conversion unit and the film thickness Zt of the transparent electrode layer do not necessarily become symmetrical. In that case, the positional relation between the central portion and the peripheral portion at the time of film formation appears as a film thickness distribution across the plurality of substrates. In this case, the conversion device is characterized in that, for example in the case of the substrate being rectangular, a film thickness (Zta) of the transparent electrode layer near at least one corner (corner "a") is larger than a film thickness (Ztb) of the transparent electrode layer near any other corner (corner "b"), and it is thereby possible to suppress partial limitations on the generation current, so as to improve characteristics of the thin film photoelectric conversion device.

Figure 2:
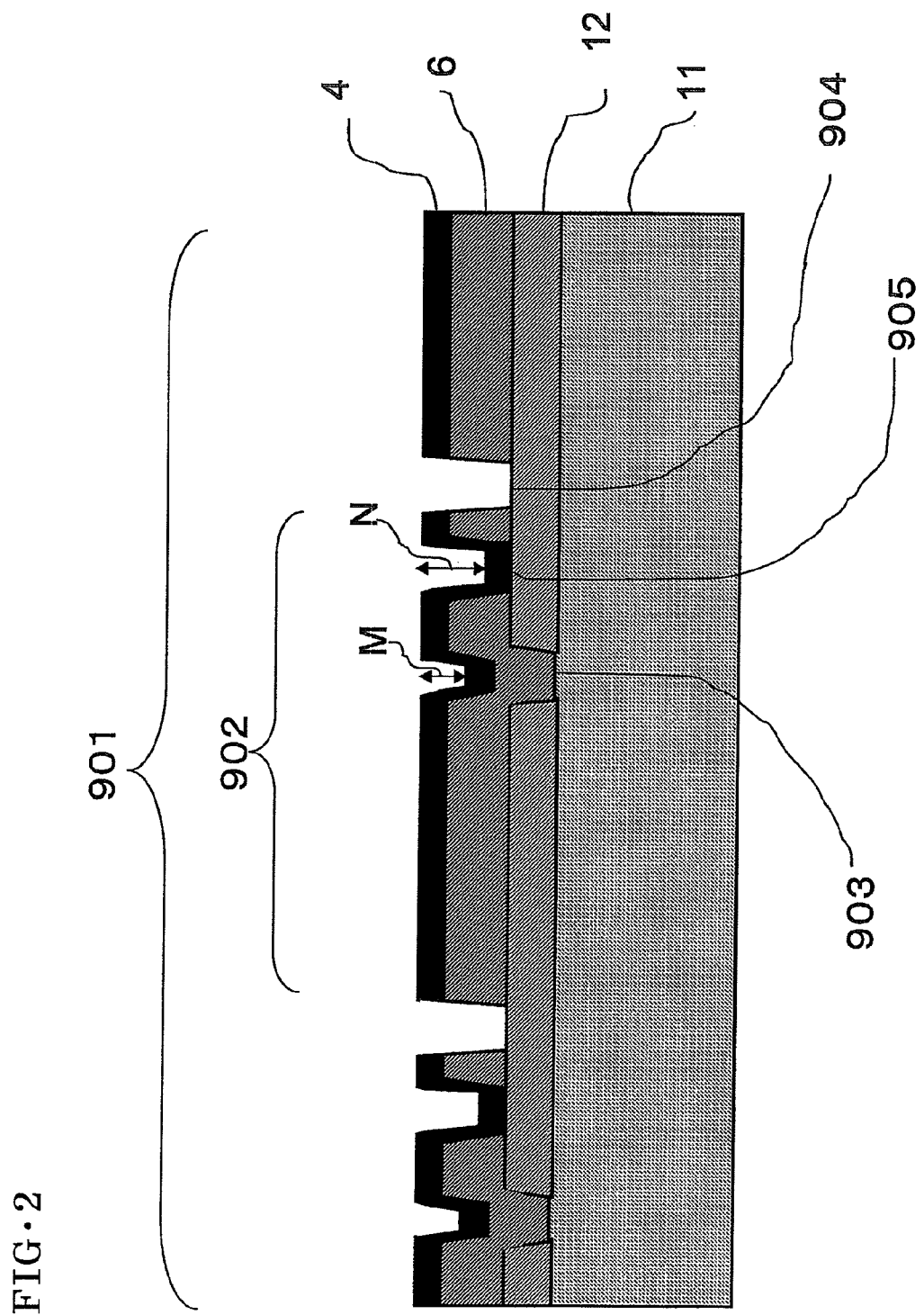
FIG. 2 is a cross-sectional view of an integrated-type thin film photoelectric conversion device as one embodiment of the present invention.

FIG. 2 shows a cross-sectional view of an integrated-type thin film photoelectric conversion device 901 of FIG. 1. A photoelectric conversion cell 902 is divided from an adjacent photoelectric conversion cell by a first separation groove 903 dividing the transparent electrode layer 12 and a second separation groove 904 dividing the photoelectric conversion unit 6 and the back electrode layer 4. Further, the back electrode layer 4 of one photoelectric conversion cell is connected to the transparent electrode layer 12 of the adjacent photoelectric conversion cell by a connection groove 905 dividing the photoelectric conversion unit 6 and buried by a back electrode layer material, so as to be electrically connected in series.

In the back electrode layer at a position of the first separation groove 903, a concave portion M corresponding to the film thickness of the transparent electrode layer 12 is formed. By measuring a depth of this concave M, the film thickness Zt of the transparent electrode layer can be measured. Similarly, in the back electrode layer at a position of the connection groove 905, a concave portion N corresponding to the film thickness of the photoelectric conversion unit 6 is formed. By measuring a depth of this concave N, the film thickness Zs of the photoelectric conversion unit can be measured. The depths of the concave portion M and the concave portion N can be measured with a stylus-type surface step difference gage or a laser microscope. For example, using a confocal scanning laser microscope LEXT OLS3000, manufactured by OLYMPUS CORPORATION, the film thickness Zt of the transparent electrode layer and the film thickness Zs of the photoelectric conversion unit can be measured respectively from the depths of the concave portions M and N.

Further, after formation of the transparent electrode layer 12 on the substrate 11, light is made incident from the transparent electrode layer side so that the film thickness Zt of the transparent electrode layer can be calculated from interference of a reflection spectrum or a transmission spectrum. Further, after formation of the photoelectric conversion unit on the transparent electrode layer 12, light is made incident from the photoelectric conversion unit side so that the film thickness Zs of the photoelectric conversion unit can be calculated from interference of a reflection spectrum.

Figure 4:
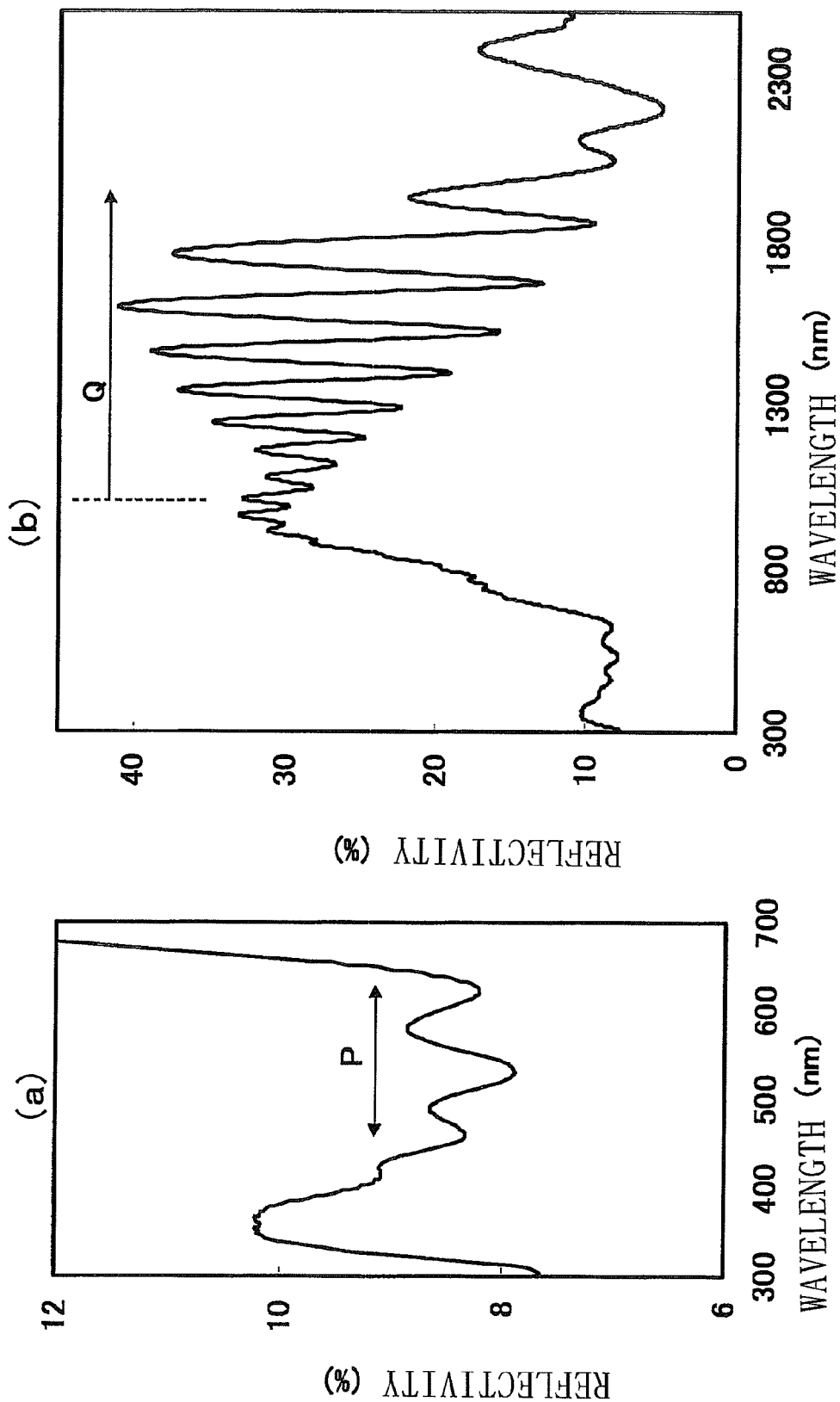
FIG. 4 is a reflection spectrum of the thin film photoelectric conversion device as one embodiment of the present invention.

Alternately, in the case of a state where the layers up to the back electrode layer are formed and the thin film photoelectric conversion device is thus completed, the film thickness can be evaluated from a reflection spectrum of light incident from the glass substrate side as shown in FIG. 4. Specifically, the film thickness Zt of the transparent electrode layer can be measured from peaks or bottoms of interference in a visible area around 500 nm shown in P of FIG. 4(a). With an absorption coefficient of the photoelectric conversion unit being high in this wavelength region, light incident into the photoelectric conversion unit is hardly reflected, and does not appear in the reflection spectrum. Therefore, the interference of the reflection spectrum is generated due to the film thickness of the transparent electrode layer. Specifically, Zt can be calculated from Formula T below.

$$Z_t = 1/2 n_t \cdot \lambda_a \lambda_b / (\lambda_a - \lambda_b) \quad \text{Formula T}$$

Herein, $n_t$ is a refractive index of the transparent electrode layer, and $\lambda_a$, $\lambda_b$ are adjacent peak wavelengths or bottom wavelengths of the reflection spectrum ($\lambda_a > \lambda_b$).

Further, the film thickness Zs of the photoelectric conversion unit can be measured from peaks or bottoms of interference in a long-wavelength region which is not shorter than 1000 nm indicated as Q in FIG. 4(b). In this wavelength region, with a refractive index of the transparent electrode layer being as low as about 2, interference with wide wavelength-intervals is generated, and peaks and bottoms of the reflection spectrum do not significantly appear. As opposed to this, with a refractive index of the photoelectric conversion unit being as high as about 3.5, interference with narrow wavelength-intervals is generated, and peaks and bottoms of the reflection spectrum significantly appear. Specifically, Zs can be calculated from Formula S below.

$$Z_t = 1/2 n_s \cdot \lambda_A \lambda_B / (\lambda_A - \lambda_B) \quad \text{Formula S}$$

Herein, $n_s$ is a refractive index of the transparent electrode layer, and $\lambda_A$, $\lambda_B$, are adjacent peak wavelengths or bottom wavelengths of the reflection spectrum ($\lambda_A > \lambda_B$).

In the case of FIG. 4, the film thickness Zt of the transparent electrode layer is about 820 nm, and the film thickness Zs of the photoelectric conversion unit is about 2300 nm.

Further, the back electrode layer is removed by wet etching or dry etching so that the film thickness Zs of the photoelectric conversion unit can be measured from a reflection spectrum of light incident on the photoelectric conversion unit. Alternatively, the photoelectric conversion unit is partially removed by wet etching or dry etching with use of a resist or a mask to form a difference in height so that the film thickness Zs of the photoelectric conversion unit can be measured by using the laser microscope or the stylus-type surface step difference gage.

Moreover, the back electrode layer and the photoelectric conversion unit are removed by wet etching or dry etching so that the film thickness Zt of the transparent electrode layer can be measured from a reflection spectrum of light incident on the transparent electrode layer. Alternatively, the transparent electrode layer is partially etching-removed by wet etching or dry etching with use of a resist or a mask to form a difference in height so that the film thickness Zt of the transparent electrode layer can be measured by using the laser microscope or the stylus-type surface difference in height gage.

When a film thickness is measured by using the laser microscope or the stylus-type surface difference in height gage, a depth of a concave section is the order of 30 µm to several mm. Further, when the film thickness is measured from a transmission spectrum or a reflection spectrum, a light spot holds a size of the order of several mm. Therefore, the "film thickness" mentioned in the present invention indicates a film thickness averaged with a size of 30 µm to several mm in the parallel direction to the main surface of the substrate. As opposed to this, intervals of irregularities of the transparent electrode layer which are effective for light confinement are the order of 10 nm to 1 µm, and are so small as to be sufficiently ignorable as compared with a measured length of the above film thickness. That is, the "film thickness" mentioned in the present invention is not one showing irregularities with intervals of 10 nm to 1 µm which are effective for light confinement.

FIG. 3 shows a cross-sectional view of a thin film photoelectric conversion device as an example of the embodiment of the present invention. There is provided a substrate 1 for a thin film photoelectric conversion device, in which the transparent electrode layer 12 is formed on the transparent substrate 11. Thereon, the photoelectric conversion unit 6 and the back electrode layer 4 are arranged in this order, to form a thin film photoelectric conversion device 5. As shown in FIG. 3, the photoelectric conversion unit 6 may be configured of a plurality of photoelectric conversion units which are the front photoelectric conversion unit 2 and the back photoelectric conversion unit 3.

The present invention is characterized in that the increasing rate ΔZt of the film thickness of the transparent electrode layer and the increasing rate ΔZs of the film thickness of the photoelectric conversion unit along one line segment X in the parallel direction to the main surface of the substrate have different signs.

The irregularities on the surface of the transparent electrode layer 12 shown in FIG. 3 preferably have a haze ratio of the order of 10 to 50% in a state where the transparent electrode layer 12 is formed on the transparent substrate 11 in order to obtain an appropriate light confinement effect for the thin film photoelectric conversion device. An average height difference between the irregularities on the surface of the transparent electrode layer which has such a haze ratio is the order of 10 to 300 nm, and the intervals between the irregularities in the parallel direction to the main surface of the substrate are 10 nm to 1 µm. In the case of the irregularities on the surface of the transparent electrode layer 12 being excessively small, a sufficient light confinement effect cannot be obtained, and in the case of the irregularities on the surface being excessively large, it may cause an electrical and mechanical short circuit in the photoelectric conversion device, or may bring about deterioration in characteristics of the photoelectric conversion device.

As the transparent electrode layer 12 of the present invention, there can be used a transparent conductive oxide, such as $SnO_2$ or ZnO, or the like having irregularities on the surface.

Especially, a layer formed of ZnO by a low-pressure thermal CVD method is preferred as the transparent electrode layer because, with the layer being formable at a low temperature of not higher than 200° C., a variety of substrates (e.g. an organic film with a high melting point, examples of which include polyimide, polyethylene naphthalate, polyethylene terephthalate, polyphenylene sulfide and polytetrafluoroethylene, or low-priced glass having a low melting point, etc) are usable and the layer is provided with a surface texture structure useful for the light confinement effect in a long-wavelength region which is important for the stacked-type thin film photoelectric conversion device. In the case of using such low-pressure thermal CVD device, the layer is preferably formed at a substrate temperature of not lower than 150° C., or 150 to 170° C. in a preferred aspect, at a pressure of 5 to 1000 Pa, using diethyl zinc (DEZ) as a material gas, water, a doping gas and a diluting gas.

In the low-pressure CVD device, a shower plate is desirably arranged inside a vacuum chamber, the shower plate introducing a gas to the substrate arranged in contact with a heater, and to a position facing the substrate. It is desirable to mix all the gases and then introduce the mixed gas into the vacuum chamber through a large number of holes of the shower plate. Alternatively, in order to suppress reaction of DEZ with water inside the shower plate, DEZ and water may be introduced into the vacuum chamber along respectively different channels, and mixed inside the vacuum chamber. An exhaust valve controller is desirably provided for making pressure constant at the time of film formation. Further, a pump for exhausting a residual gas after the film formation and a detoxifying device are desirably provided.

As the material gas of zinc, other than the above, dimethyl zinc can also be used. As a material gas of oxygen, there can be used oxygen, carbon dioxide, carbon monoxide, dinitrogen monoxide, nitrogen dioxide, sulfur dioxide, dinitrogen pentoxide, alcohols (R(OH)), ketones (R(CO)R'), ethers (ROR'), aldehydes (R(COH)), amides ($(RCO)_x(NH_{3-x})$, x=1, 2, 3), or sulfoxides (R(SO)R') (where R and R' are alkyl groups). As the diluting gas, a noble gas (He, Ar, Xe, Kr, Rn), nitrogen, hydrogen or the like can also be used. As the doping gas, diborane ($B_2H_6$), alkyl aluminum, alkyl gallium, or the like can be used. It is preferable that a ratio of DEZ to water be from 1:1 to 1:5, and a ratio of DEZ to $B_2H_6$ be not smaller than 0.05%. Since DEZ and water are liquid at normal temperature and normal pressure, these are desirably supplied after being evaporated by heating evaporation, bubbling, spraying or the like.

It is to be noted that the substrate temperature mentioned herein means a temperature of the surface of the substrate which is in contact with a heating section of the film-forming device. In the thermal CVD method, with increase in substrate temperature, a film growth reaction is activated and the film thickness tends to become larger, and the film thickness distribution is controllable by fine-tuning a heater balance of the substrate temperature.

Figure 5:
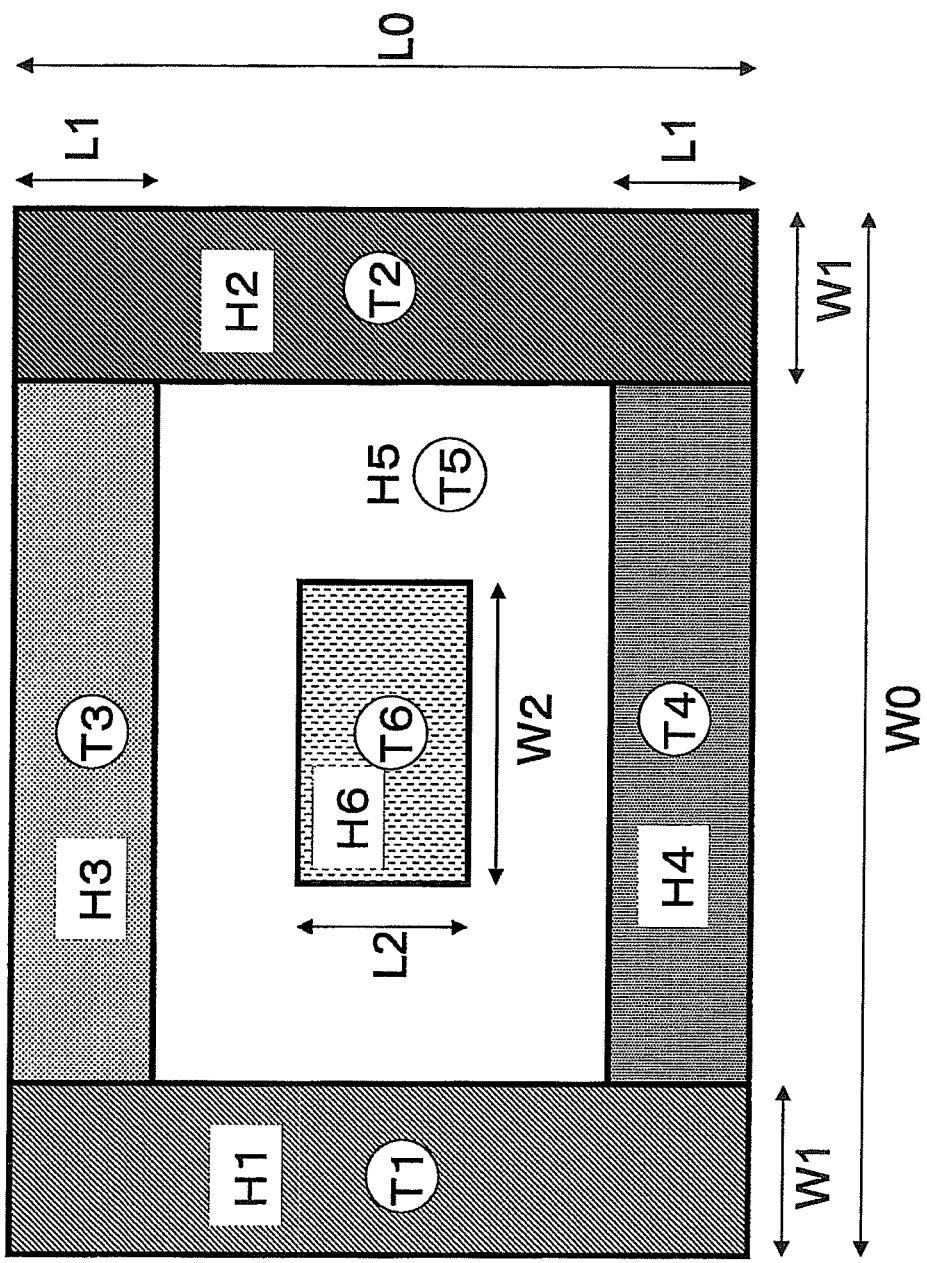
FIG. 5 is a layout of heaters of low-pressure thermal CVD device as one embodiment of the present invention.

For example, as shown in FIG. 5, with use of six heaters of heaters H1 to H6, a film thickness distribution of a transparent electrode layer on a rectangular substrate can be controlled. A width W0 and a length L0 of the entire heater are desirably made larger by not less than 10% than a width and a length of the substrate. Making the size of the entire heater by not less than 10% than the size of the substrate can suppress escape of heat from the end portion of the substrate, and consequently prevent a decrease in temperature of the end portion of the substrate.

Further, it is desirable to make W1 have a length of 10 to 25% of W0, and W2 to have a length of 30 to 60% of W0. Moreover, it is desirable to make L1 to have a length of 10 to 25% of L0, and L2 to have a length of 30 to 60% of L0. Since a heater on a more outer side is more required to heat the substrate while compensating escape of heat to the outside, it is desirable to densely arrange heater lines per unit area. Making the heaters to have the arrangement and size relations as in FIG. 5 can eliminate an extreme difference in capacity among the heaters H1 to H6, to facilitate control of the heaters and also reduce cost of the device. Needless to say, the arrangement of the heaters of the present invention is not limited to the example shown in FIG. 5.

When temperatures of the substrate in contact with the heaters H1 to H6 are respectively referred to as T1 to T6, by controlling the substrate temperatures to T1 to T4>T5>T6, the film thickness distribution of the transparent electrode layer can be a distribution downwardly projected and almost symmetrical with the film thickness smaller at the central portion and larger at the end portion.

An average film thickness of ZnO is preferably from 500 to 2000 nm, and more preferably from 800 to 1800 nm. This is because, when the ZnO film is excessively thin, sufficient provision of irregularities that effectively contribute to the light confinement effect is difficult, making it hard to obtain the conductivity required as the transparent electrode, and when the film is excessively thick, an amount of light transmitted through ZnO to reach the photoelectric conversion unit is reduced due to light absorption by the ZnO film, leading to decreased efficiency. Further, in the case of the film being excessively thick, cost for the film formation increases with increase in time for the film formation. In the case where the average film thickness of this transparent electrode layer 12 is within the above mentioned range, an average height difference in irregularities on the surface is about 10 to 100 nm, and intervals of irregularities in the parallel direction to the substrate are 10 nm to 1 μm.

In the present specification, the haze ratio is chiefly used as an evaluation indicator of the irregularities of the transparent electrode layer. The haze ratio is one expressed by: (diffusion transmittance/total light ray transmittance)×100 [%]. In the present invention, as a simple evaluation method, measurement using an illuminant C was performed (JIS K7136).

The photoelectric conversion unit 6 formed on the transparent electrode layer 12 may be one photoelectric conversion unit, or a plurality of photoelectric conversion units may be stacked. When an amorphous silicon-based material is selected for the front photoelectric conversion unit 2, the unit has sensitivity to light of about 360 to 800 nm, and when a crystalline silicon-based material is selected for the back photoelectric conversion unit 3, the unit has sensitivity to light up to about 1200 nm which is longer than the above. Therefore, the thin film photoelectric conversion device 5, in which the front photoelectric conversion unit 2 with the amorphous silicon-based material and the back photoelectric conversion unit 3 with the crystalline silicon-based material are arranged in this order from the light incident side, is capable of effectively using incident light in a broader range. Here, the "silicon-based" materials include silicon alloy semiconductor materials containing silicon, such as silicon carbide and silicon germanium, as well as silicon.

The front photoelectric conversion unit 2 is formed by depositing each semiconductor layer by a plasma enhanced CVD method in the order of a pin layer, for example. Specifically, for example, layers of: a p-type amorphous silicon carbide layer, as a one-conductivity-type layer 21, doped with not less than 0.01 atomic % of boron as conductivity type determining impurity atoms; an intrinsic amorphous silicon layer, as a photoelectric conversion layer 22; and an n-type microcrystalline silicon layer, as an opposite-conductivity-type layer 23, doped with not less than 0.01 atomic % of phosphorus as conductivity type determining impurity atoms, may be deposited in this order. In this case, an amorphous silicon photoelectric conversion unit is formed.

The back photoelectric conversion unit 3 is formed by depositing each semiconductor layer by a plasma enhanced CVD method in the order of the pin layer, for example. Specifically, for example, layers of: a p-type microcrystalline silicon layer, as a one-conductivity-type layer 31, doped with not less than 0.01 atomic % of boron as the conductivity type determining impurity atoms; an intrinsic crystalline silicon layer, as a photoelectric conversion layer 32; an n-type microcrystalline silicon layer, as an opposite-conductivity-type layer 33, doped with not less than 0.01 atomic % of phosphorus as the conductivity type determining impurity atoms, may be deposited in this order.

The back electrode layer 4 is formed on the photoelectric conversion unit 3. As the back electrode, it is preferable to form at least one metal layer 42 made of at least one material selected from Al, Ag, Au, Cu, Pt and Cr by a sputtering or vacuum deposition method. Further, it is more preferable to form a conductive oxide layer 41 of ITO, $SnO_2$, ZnO or the like between the photoelectric conversion unit 3 and the metal layer 42. This conductive oxide layer 41 has functions to enhance adhesiveness between the photoelectric conversion unit 3 and the metal layer while enhancing a light reflectivity of the back electrode layer 4, and further preventing a chemical change in the photoelectric conversion unit 3.

Finally, in the case of the thin film photoelectric conversion device being a thin film solar cell or the like, a sealing resin (not shown) may be stacked to the back surface side so as to be protected.

As the sealing resin, for example, any of EVA, PVB, an olefinic resin and the like can be favorably used.

In such an integrated-type thin film photoelectric conversion device, it is characterized that a haze ratio distribution is generated in the transparent electrode layer in an integrated-type thin film solar cell formed on the transparent substrate, to make the light confinement effect have a distribution, so as to improve nonuniformity of a current value of each photoelectric conversion cell with a different film thickness of a photoelectric conversion layer.

Although the example of applying the present invention to a superstrate-type thin film photoelectric conversion device was described above, the present invention also has a similar effect on a substrate-type thin film photoelectric conversion device.

One aspect of the substrate-type thin film photoelectric conversion device is a thin film photoelectric conversion device that is at least provided with a back electrode layer, a photoelectric conversion unit and a front transparent electrode layer on a transparent or non-transparent substrate. Light is made incident from the front transparent electrode layer side. In this case, a film thickness distribution of the photoelectric conversion unit and a film thickness distribution of the front transparent electrode layer may be made with thickness distributions opposite to each other.

A manufacturing method in one embodiment of the thin film photoelectric conversion device of the present invention will be described by taking as an example the case of ZnO being made a transparent electrode layer by use of the low-pressure thermal CVD device.

For example, a flow rate of DEZ+H$_2$O at the central portion and the end portion of the transparent electrode layer at the time of film formation can be controlled so as to manufacture the photoelectric conversion device of the present invention. Specifically, a size of a hole at the central portion of a shower plate is made smaller than that at the end portion thereof, to make a gas flow rate at the central portion of the shower plate smaller than a gas flow rate at the end portion thereof. Consequently, a film thickness of the transparent electrode layer of ZnO can be made smaller at the central portion and larger at the end portion. A specific study was made, to find that a film formation speed becomes 1.2 times as high when the flow rate of DEZ+H$_2$O becomes 1.5 times as high, and by changing stepwise the size of the hole at the end portion of the shower plate to be 1.5 times as large as at the central portion thereof, it is possible to form a film thickness distribution where the film thickness at the end portion is about 1.2 times as large as at the central portion.

Alternatively, a ratio of the flow rates of DEZ/H$_2$O at the central portion and the end portion at the time of film formation can be adjusted so as to manufacture the photoelectric conversion device of the present invention. Specifically, for example, the above-mentioned low-pressure thermal CVD device is formed such that a supply port for DEZ is located at the end portion while a supply port for water is located at the center, to make the DEZ/H$_2$O ratio at the central portion smaller than that at the end portion, whereby it is possible to manufacture a transparent electrode layer having a film thickness distribution with a smaller film thickness at the central portion and a larger film thickness at the end portion. A specific study was made, to find that the film formation speed becomes 1.1 times as high when the DEZ/H$_2$O ratio becomes 1.5 times as large, and whereby it is possible to form a film thickness distribution depending upon a gas distribution with use of the above CVD device.

Alternatively, the low-pressure thermal CVD device provided with six heaters (H1, H2, H3, H4, H5, H6) as shown in FIG. 5 is used and the heaters are controlled to make a temperature difference between the central portion and the end portion of the substrate at the time of film formation, whereby it is possible to manufacture the photoelectric conversion device of the present invention. A specific study was made, to find that, when a substrate temperature at the central portion (T6) is set to 150° C., a substrate temperature at the intermediate portion set to 152.5° C. and a substrate temperature at the end portion (T1, T2, T3, T4) set to 155° C., it is possible to manufacture a transparent electrode layer having a film thickness distribution with the film thickness at the central portion being 2090 nm and the film thickness at the end portion being 2240 nm. In view of the light confinement effect, for making the transparent electrode layer have a smaller film thickness at the central portion and a larger film thickness at the end portion, it is preferable to set the temperature difference of the end portion from the central portion to not smaller than 2° C. Further, it is more preferable to set the temperature difference to the order of 4 to 6° C. from the viewpoint of integrating by laser scribing.

It is to be noted that the photoelectric conversion device of the present invention can also be manufactured by, for example, using a low-pressure thermal CVD device with a supply port for DEZ located at the center and a supply port for water located at the end portion, and appropriately setting a temperature difference between the center and the end portion at the time of film formation.

Further, when the zinc oxide is formed by a low-pressure thermal CVD method, in the method for manufacturing a thin film photoelectric conversion device according to the present invention, it is preferable that at the time of forming the transparent electrode layer, a temperature at the peripheral portion of the substrate be higher by 2 to 15° C. than a temperature at the central portion of the substrate. In such a case, it is possible to produce a thin film photoelectric conversion device as one of the best aspects of the present invention in which the film thickness Zt of the transparent electrode layer has a large thickness at the peripheral portion of the transparent substrate as compared with at the central portion thereof, and the film thickness Zs of the photoelectric conversion unit has a small thickness at the peripheral portion of the transparent substrate as compared with at the central portion thereof.

The thin film photoelectric conversion device described in the present invention is also realizable, without undue trial and error, by "a method for manufacturing a thin film photoelectric conversion device wherein the transparent electrode layer is zinc oxide formed by a low-pressure thermal CVD method, and as for temperatures of the substrate in forming the transparent electrode layer, a difference is made between a temperature of the central portion of the substrate and a temperature of the peripheral portion of the substrate."

As described above, the film thickness Zs of the photoelectric conversion unit is often smaller at the peripheral portion than at the central portion when produced by a plasma enhanced CVD method. In that case, the film thickness Zt of the transparent electrode layer is preferably made larger at the peripheral portion of the substrate than at the central portion thereof.

On the other hand, when the film thickness Zs of the photoelectric conversion unit is produced by a plasma enhanced CVD method, the film thickness of the photoelectric conversion unit can also be made larger at the peripheral portion than at the central portion (or, smaller at the central portion and larger at the peripheral portion). In this case, the film thickness Zt of the transparent electrode layer is desirably made smaller at the peripheral portion of the substrate than at the central portion thereof.

Generally, in the case of film formation of the photoelectric conversion unit by a plasma enhanced CVD method, ordinary film-forming conditions for the photoelectric conversion unit are, for example, as follows:

Hydrogen flow rate/silane flow rate=about 50 to 500 (about 5 to 500 in the case of forming an amorphous photoelectric conversion layer)

Plasma discharge power=about 0.010 to 0.500 W/cm$^2$

Film formation pressure=about 600 to 2600 Pa

Distance between electrodes in plasma enhanced CVD electrode: about 5 to 20 mm

In the case of producing the film thickness Zs of the photoelectric conversion unit by a plasma enhanced CVD method, the following measure may be taken so as to make the film thickness of the photoelectric conversion unit larger at the peripheral portion than at the central portion (or, smaller at the central portion and larger at the peripheral portion):

The film formation pressure at the time of film formation is lowered in the case of the other parameters being constant.

The distance between electrodes is made shorter in the case of the other parameters being constant.

Although absolute values of the film-forming conditions cannot be indiscriminately specified based upon a configuration, arrangement and the like of the CVD device, adopting the above measure and guide allows a person skilled in the art to perform film formation of the photoelectric conversion unit having a smaller film thickness at the central portion and a larger film thickness at the peripheral portion, without the need for an excessive attempt. Accordingly, the present invention sufficiently satisfies the enablement requirement.

By taking the measure as described above, the following manufacturing method of the present invention is attainable. That is, it is a method for manufacturing a thin film photoelectric conversion device as one aspect of the present invention, the method at least including one or more selected from the group consisting of:

a step of forming on a substrate a transparent electrode layer having a large film thickness at a peripheral portion as compared with a film thickness at a central portion, and a step of forming on the transparent electrode layer a photoelectric conversion unit having a small film thickness at a peripheral portion as compared with a film thickness at a central portion;

a step of forming on the substrate a transparent electrode layer having a small film thickness at a peripheral portion as compared with a film thickness at a central portion, and a step of forming on the transparent electrode layer a photoelectric conversion unit having a large film thickness at a peripheral portion as compared with a film thickness at a central portion;

a step of forming on the substrate a photoelectric conversion unit having a large film thickness at a peripheral portion as compared with a film thickness at the central portion, and a step of forming on the photoelectric conversion unit a transparent electrode layer having a small film thickness at a peripheral portion as compared with a film thickness at a central portion; and a step of forming on the substrate a photoelectric conversion unit having a small film thickness at a peripheral portion as compared with a film thickness at a central portion, and a step of forming on the photoelectric conversion unit a transparent electrode layer having a large film thickness at a peripheral portion as compared with a film thickness at a central portion.

It is possible to manufacture the thin film photoelectric conversion device of the present invention by the manufacturing method including one or more selected from the above four groups.

As for the description "a distribution of the film thickness of the transparent electrode layer and a distribution of the film thickness of the photoelectric conversion unit have an opposite thickness-distribution relation" mentioned in the present invention, an example thereof is to "have a relation between a transparent electrode layer having a larger film thickness at a peripheral portion than at a central portion and a photoelectric conversion unit having a smaller film thickness at a peripheral portion than at a central portion", as described above. Another example is to "have a relation between a transparent electrode layer having a smaller film thickness at a peripheral portion than at a central portion and a photoelectric conversion unit having a larger film thickness at a peripheral portion than at a central portion, on the substrate". In such a case of "having an opposite thickness-distribution relation", can be said as "when one line segment in a parallel direction to a main surface of the substrate is taken as X, respective signs are different between an increasing rate $\Delta Zt$ along X of a film thickness $Zt$ of the transparent electrode layer and an increasing rate $\Delta Zs$ along X of a film thickness $Zs$ of the photoelectric conversion unit", in a microscopic view. Further, another aspect is, in a microscopic view, "the substrate is rectangular, a film thickness $Zta$ of the transparent electrode layer near at least one corner 'a' of the substrate is larger than the film thickness $Ztb$ of the transparent electrode layer near any other corner 'b' of the substrate, and a film thickness $Zsa$ of the photoelectric conversion unit near the corner 'a' is smaller than the film thickness $Zsb$ of the photoelectric conversion unit near the corner 'b'".

As described above, the thin film photoelectric conversion device of the present invention is also realizable, for example, by the manufacturing method of the present invention without undue trial and error.

The present invention may be a tandem type silicon-based thin film photoelectric conversion device. There is, for example, such an aspect that a transparent electrode is formed, an amorphous photoelectric conversion unit as a first photoelectric conversion unit is formed, and thereupon, a crystalline photoelectric conversion unit as a second photoelectric conversion unit is further formed by a plasma enhanced CVD method.

Although the two-stacked tandem type photoelectric conversion device of the amorphous photoelectric conversion unit and the crystalline photoelectric conversion unit was described as an example in the present specification, it goes without saying that the present invention is also applicable to a multi-stacked tandem type photoelectric conversion device further including one or more amorphous photoelectric conversion units and/or one or more crystalline photoelectric conversion units.

It is to be noted that the photoelectric conversion device of the present invention may be provided with a silicon composite layer containing a silicon crystal phase in an amorphous alloy of silicon and oxygen, as one having a lower refractive index than a refractive index of the i-type photoelectric conversion layer in the photoelectric conversion unit. When the photoelectric conversion device comprises the silicon composite layer, for example, it may be formed by arranging an i-type crystalline silicon-based photoelectric conversion layer and a silicon composite layer, doped with phosphorus containing a silicon crystalline phase in an amorphous alloy of silicon and oxygen, in this order from the light incident side. With the silicon composite layer having a smaller refractive index than a refractive index of the i-type layer, it is possible to increase the light confinement effect due to promotion of reflection on the side farther from the light incident side, and the like. The silicon composite layer is described, for example, in Japanese Patent Laid-Open Publication No. 2005-45129 and Japanese Patent Laid-Open Publication No. 2008-300872.

It is to be noted that a refractive index of the silicon composite layer with respect to light having a wavelength of 600 nm is desirably not less than 1.7 and not more than 2.5. The silicon composite layer preferably has the refractive index of not less than 1.7 and not more than 2.5, and further preferably has the refractive index of not less than 1.8 and not more than 2.1 with respect to light having a wavelength of 600 nm, in view of achieving sufficient reflection effect.

Further, an oxygen concentration in the silicon composite layer is desirably not less than 25 atomic % and not more than 60 atomic % Moreover, for realization of a low refractive index, the oxygen concentration in the silicon composite layer is preferably not less than 25 atomic % and not more than 60 atomic %, more preferably 40 atomic % and not more than 60 atomic %, and further preferably not less than 40 atomic % and not more than 55 atomic %.

When the silicon composite layer has been doped, it is possible to make the oxygen concentration high for realizing a lower refractive index than that of the i-layer as the photoelectric conversion layer, so as to obtain a high reflection effect on the interface.

In addition, one aspect of the photoelectric conversion unit and the like will be simply described.

As one aspect, a crystalline silicon-based photoelectric conversion unit is formed on the substrate. All semiconductor layers included in the crystalline silicon-based photoelectric conversion unit can be deposited by a plasma enhanced CVD method under a substrate temperature of not higher than 400° C. As the plasma enhanced CVD method, a commonly used RF plasma enhanced CVD method is normally used, and besides, a plasma enhanced CVD method using a high-frequency power source from an RF band to a VHF band in a frequency not more than 150 MHz may also be employed.

As one aspect, an amorphous silicon-based photoelectric conversion unit is formed on the substrate.

Although the method for realizing the film thickness distribution of the transparent electrode layer according to the present invention was mainly described in detail, a method for realizing the photoelectric conversion unit of the present invention is also not limited to contents described in examples and the like.

The p-type layer can be deposited by a plasma enhanced CVD method. As the p-type layer, a p-type silicon-based thin film doped with boron or some other film can be used. Further, as a material for the p-type layer, an alloy material such as amorphous silicon carbide or amorphous silicon germanium, as well as crystalline silicon and amorphous silicon, may be used. In addition, polycrystalline silicon, microcrystalline silicon partially containing amorphous, or a crystalline silicon-based alloy material of those crystalline materials may also be used. Moreover, a technique may be adopted which irradiates the deposited p-type crystalline silicon layer with pulse laser light to control a carrier concentration by means of a crystallization proportion or conductivity type determining impurity atoms. In the case of forming the p-type crystalline silicon layer by a plasma enhanced CVD method, hydrogenated silane-based gas such as mono-silane and or disilane can be used as the material gas, diborane can be used as the doping gas for example in the case of boron doping, and further, in addition to these gases, a diluting gas such as hydrogen may be mixed.

(Silicon-Based Photoelectric Conversion Layer)

As the photoelectric conversion layer, there can be used: a non-doped, substantially i-type polycrystalline silicon thin film, a substantially i-type microcrystalline silicon thin film with a volume crystallization proportion of not less than 90%, or a weak p-type or weak n-type crystalline silicon-based thin film material containing a slight amount of impurities and sufficiently provided with a photoelectric conversion function. Further, these materials are not decisive ones for the photoelectric conversion layer, but a silicon-based alloy material such as silicon carbide or amorphous silicon germanium may also be used. While the film thickness of the photoelectric conversion layer is arbitrarily adjusted, when the thickness is set within the range of 0.5 to 20 μm, the photoelectric conversion layer has a necessary and sufficient film thickness as the crystalline silicon-based thin film photoelectric conversion layer.

Since being formed under a substrate temperature as low as not higher than 400° C., the crystalline photoelectric conversion layer contains a large amount of hydrogen atoms that terminate and inactivate a defect in a grain boundary or within a grain, and has a hydrogen content within a preferable range of 1 to 30 atomic %. Further, many of grains contained in this crystalline silicon-based thin film photoelectric conversion device grow as extending from the ground layer upward in columnar form. These many grains have a preferential crystalline orientation plane of (110) parallel to the film surface, and in its X ray diffraction, a strength ratio of a diffraction peak (111) to a diffraction peak (220) is within a preferable range of not more than 0.2. Furthermore, since the substrate temperature at the time of depositing the photoelectric conversion layer 32 by a plasma enhanced CVD method is not higher than 400° C., the foregoing low-priced substrate can be used.

As a main component of a gas introduced into a plasma reaction chamber, there can be used a silane-based gas added with a diluting gas such as hydrogen. Although a flow rate of the diluting gas is preferably not less than 20 times as high as a flow rate of the silane gas, an appropriate dilution amount is set based upon relations with other film-forming conditions, such as discharge power and pressure in the reaction chamber. Although mono-silane, disilane or the like is preferred as the silane-based gas, in addition to these, halogenated silicon gases such as silicon tetrafluoride, silicon tetrachloride or dichlorosilane may also be used. Further, in addition to these, an inert gas such as a noble gas, preferably helium, neon, argon or the like, may also be used.

(n-type Layer)

As the n-type layer, for example, an n-type microcrystalline silicon-based thin film doped with phosphorus or the like can be used. These conditions for the n-type layer are not restrictive, and as the impurity atoms, for example, nitrogen or the like may be used.

It is to be noted that the present invention can also be expressed as follows. The following contents 1 to 5 are those of the claims of the earlier priority application of the present application. One aspect of the present invention can also be expressed as follows. It is noted that a substrate was limited to a transparent substrate in the earlier priority application of the present application.

1. A thin film photoelectric conversion device, including: a transparent substrate; a transparent electrode layer; a photoelectric conversion unit; and a back electrode layer, wherein a distribution of a film thickness of the transparent electrode layer and a distribution of a film thickness of the photoelectric conversion unit have an opposite thickness-distribution relation.

A thin film photoelectric conversion device, including: at least one photoelectric conversion unit deposited on a substrate for a thin film photoelectric conversion device which is made up of a transparent substrate and a transparent electrode layer deposited thereon; and a back electrode layer, wherein, when a photoelectric conversion layer of the photoelectric conversion unit has a film thickness distribution projected upward with respect to its film formation surface, the transparent electrode layer is provided with a film thickness distribution projected downward, having been adjusted such that the transparent electrode layer is opposed thereto.

2. The thin film photoelectric conversion device according to 1, wherein the transparent electrode layer has a smaller thickness at a central portion of its film formation surface and has a larger thickness at a peripheral portion of the film formation surface, and the photoelectric conversion unit has a larger thickness at a central portion of its film formation surface and has a smaller thickness at a peripheral portion of the film formation surface.

3. The thin film photoelectric conversion device according to 1 or 2, wherein at least one of the photoelectric conversion units is an amorphous photoelectric conversion unit.

4. The thin film photoelectric conversion device according to any one of 1 to 3, wherein at least one of the photoelectric conversion units is a crystalline photoelectric conversion unit.

Further, the present invention is a thin film photoelectric conversion device where at least one of the photoelectric conversion units is an amorphous photoelectric conversion unit. Including an amorphous photoelectric conversion unit can lead to formation of the thin film photoelectric conversion device with a larger area at lower-cost than a thin film photoelectric conversion device using a monocrystalline or a polycrystalline material.

Moreover, the present invention is a thin film photoelectric conversion device where at least one of the photoelectric conversion units is a crystalline photoelectric conversion unit. Including the crystalline photoelectric conversion unit can lead to further effective improvement in characteristics of the thin film photoelectric conversion device since the amorphous silicon-based photoelectric conversion layer has sensitivity to light of about 360 to 800 nm and the crystalline silicon-based photoelectric conversion layer has sensitivity to light up to about 1200 nm, which is longer than the above.

5. The thin film photoelectric conversion device according to any one of 1 to 4, including: a transparent substrate; a transparent electrode layer; a photoelectric conversion unit; and a back electrode layer, wherein a photoelectric conversion cell made up of the transparent electrode layer, the photoelectric conversion unit and the back electrode layer is divided by a plurality of separation grooves so as to form a plurality of photoelectric conversion cells, and the plurality of photoelectric conversion cells are electrically connected in series with one another through a plurality of connection grooves.

EXAMPLES

Hereinafter, detailed descriptions will be given based upon examples according to the present invention and comparative examples according to the related art. In each figure, the same member is provided with the same reference numeral, and a redundant description is not given. Further, results of the comparative examples and the examples are summarized in Table 1. It should be noted that the present invention is not limited to the following examples so long as not exceeding the spirit of the invention.

TABLE 1

| No. | Voc (V) | Jsc (mA/cm$^2$) | FF | Eff (%) |
| --- | --- | --- | --- | --- |
| Reference Example 4 | 1.354 | 12.52 | 0.719 | 12.19 |
| Reference Example 5 | 1.347 | 12.81 | 0.715 | 12.34 |
| Reference Example 6 | 1.345 | 12.92 | 0.718 | 12.48 |
| Comparative Example 1 | 1.334 | 11.89 | 0.703 | 11.16 |
| Comparative Example 2 | 1.342 | 11.36 | 0.709 | 10.81 |
| Example 1 | 1.341 | 12.53 | 0.710 | 11.93 |
| Example 2 | 1.337 | 13.25 | 0.705 | 12.49 |
| Example 3 | 1.339 | 13.02 | 0.706 | 12.31 |
| Comparative Example 3 | 1.305 | 11.63 | 0.698 | 10.59 |
| Example 4 | 1.307 | 12.93 | 0.704 | 11.90 |
| Example 5 | 1.323 | 13.02 | 0.705 | 12.14 |

Reference Example 1

As Reference Example 1, a thin film photoelectric conversion device 1 was produced. Specifically, on the transparent substrate 11 as a glass substrate of 125×3125 mm and 4 mm in thickness, the transparent electrode layer 12 made of ZnO was formed by a low-pressure thermal CVD method. Heaters of low-pressure CVD device used are arranged as shown in FIG. 5, W0 is 600 mm, and L0 is 500 mm. The substrate was placed on the heater H6 at the center, and the transparent electrode layer 12 was formed. This transparent electrode layer 12 was formed with substrate temperatures T1 to T6 being 150° C., a pressure being 30 Pa, a flow rate of evaporated diethyl zinc being 200 sccm, a flow rate of evaporated water being 700 sccm, a flow rate of diborane ($B_2H_6$) being 2 sccm, and a flow rate of hydrogen being 1000 sccm. An average of film thicknesses Zt of the transparent electrode layer was 1661 nm, a deviation of the film thickness was ±3.9%, and a distribution thereof was uniform. Further, a haze ratio measured by using an illuminant C of Reference Example 1 was 27.6%.

Reference Example 2

As Reference Example 2, the substrate 1 for a thin film photoelectric conversion device was produced in a similar manner as in Reference Example 1. However, the difference from Reference Example 1 is that film formation time was adjusted longer in order to change a film thickness. An average of film thicknesses Zt of this transparent electrode layer was 1837 nm, and a haze ratio was 33.0%.

Reference Example 3

As Reference Example 3, the substrate 1 for a thin film photoelectric conversion device was produced in a similar manner as in Reference Example 1. However, the difference from Reference Example 1 is that film formation time was adjusted longer than in Reference Example 2 in order to change a film thickness. An average of film thicknesses Zt of this transparent electrode layer was 1907 nm, and a haze ratio was 35.4%.

Reference Example 4

As Reference Example 4, on the substrate 1 for a thin film photoelectric conversion device, produced in Reference Example 1 and having a transparent electrode layer with a film thickness of 1661 nm, the amorphous photoelectric conversion unit 2, the crystalline photoelectric conversion unit 3 and the back electrode layer 4 were formed, to produce a stacked-type thin film photoelectric conversion device. Further, a small-area thin film photoelectric conversion device of 10 mm square was formed by laser scribing.

Specifically, the thin film photoelectric conversion device of Reference Example 4 was formed as follows. On the transparent electrode layer 12 formed in Reference Example 1, the amorphous photoelectric conversion unit as the front photoelectric conversion unit 2 was formed using a plasma enhanced CVD method, the unit including: the one-conductivity-type layer 21 made up of a p-type microcrystalline silicon layer with a setting film thickness of 10 nm and a p-type amorphous silicon carbide layer with a setting film thickness of 15 nm; the photoelectric conversion layer 22 made of an intrinsic amorphous silicon layer with a setting film thickness of 350 nm; and the opposite-conductivity-type layer 23 made of an n-type microcrystalline silicon layer with a setting film thickness of 15 nm.

Subsequently, the crystalline silicon photoelectric conversion unit as the back photoelectric conversion unit 3 was sequentially formed by a plasma enhanced CVD method, the unit including: the one-conductivity-type layer 31 made of a p-type microcrystalline silicon layer with a setting film thickness of 15 nm; the photoelectric conversion layer 32 made of an intrinsic crystalline silicon layer with a setting film thickness of 2.5 μm; and the opposite-conductivity-type layer 33 made of an n-type microcrystalline silicon layer with a setting film thickness of 15 nm.

The photoelectric conversion unit 6 made up of the front photoelectric conversion unit 2 and the back photoelectric conversion unit 3 was formed in this manner, and thereafter a film thickness of the photoelectric conversion unit 6 was measured. Light was made incident from the photoelectric conversion unit side and the film thickness of the photoelectric conversion unit 6 was measured by a reflection spectrum, to obtain 2870 nm.

Next, as the back electrode layer 4, the conductive oxide layer 41 of ZnO having a thickness of 90 nm and doped with Al, and the metal layer 42 of Ag having a thickness of 200 nm were sequentially formed by a sputtering method.

Finally, using a YAG laser with a second harmonic of 532 nm, a small-area thin film photoelectric conversion device with a size of a 10 mm square was formed penetrating the front photoelectric conversion unit 2, the back photoelectric conversion unit 3 and the back electrode layer 4.

The small-area thin film photoelectric conversion device as thus obtained was irradiated with light of Air Mass 1.5 (AM 1.5) having a light amount of 100 mW/cm$^2$, and output characteristics were measured, to obtain a short-circuit current (Jsc) of 12.52 mA/cm$^2$, an open-circuit voltage (Voc) of 1.354 V, a fill factor (FF) of 0.719, and a conversion efficiency (Eff) of 12.19%.

Reference Example 5

As Reference Example 5, a small-area thin film photoelectric conversion device with the same structure as that of Reference Example 4 was produced using the substrate 1 for a thin film photoelectric conversion device, having been obtained in Reference Example 2. A film thickness of the photoelectric conversion unit 6 was measured in a similar manner as in Reference Example 4, to obtain 2900 nm. Output characteristics of the obtained thin film photoelectric conversion device were measured in a similar manner as in Reference Example 4, to obtain a Jsc of 12.81 mA/cm$^2$, an open-circuit voltage (Voc) of 1.347 V, a fill factor (FF) of 0.715, and a conversion efficiency (Eff) of 12.34%.

Reference Example 6

As Reference Example 6, a small-area thin film photoelectric conversion device with the same structure as that of Reference Example 4 was produced using the substrate 1 for a thin film photoelectric conversion device, having been obtained in Reference Example 3. A film thickness of the photoelectric conversion unit 6 was measured in a similar manner as in Reference Example 4, to obtain 2880 nm. Output characteristics of the obtained thin film photoelectric conversion device were measured in a similar manner as in Reference Example 4, to obtain a Jsc of 12.92 mA/cm$^2$, an open-circuit voltage (Voc) of 1.345 V, a fill factor (FF) of 0.718, and a conversion efficiency (Eff) of 12.48%.

Figure 6:
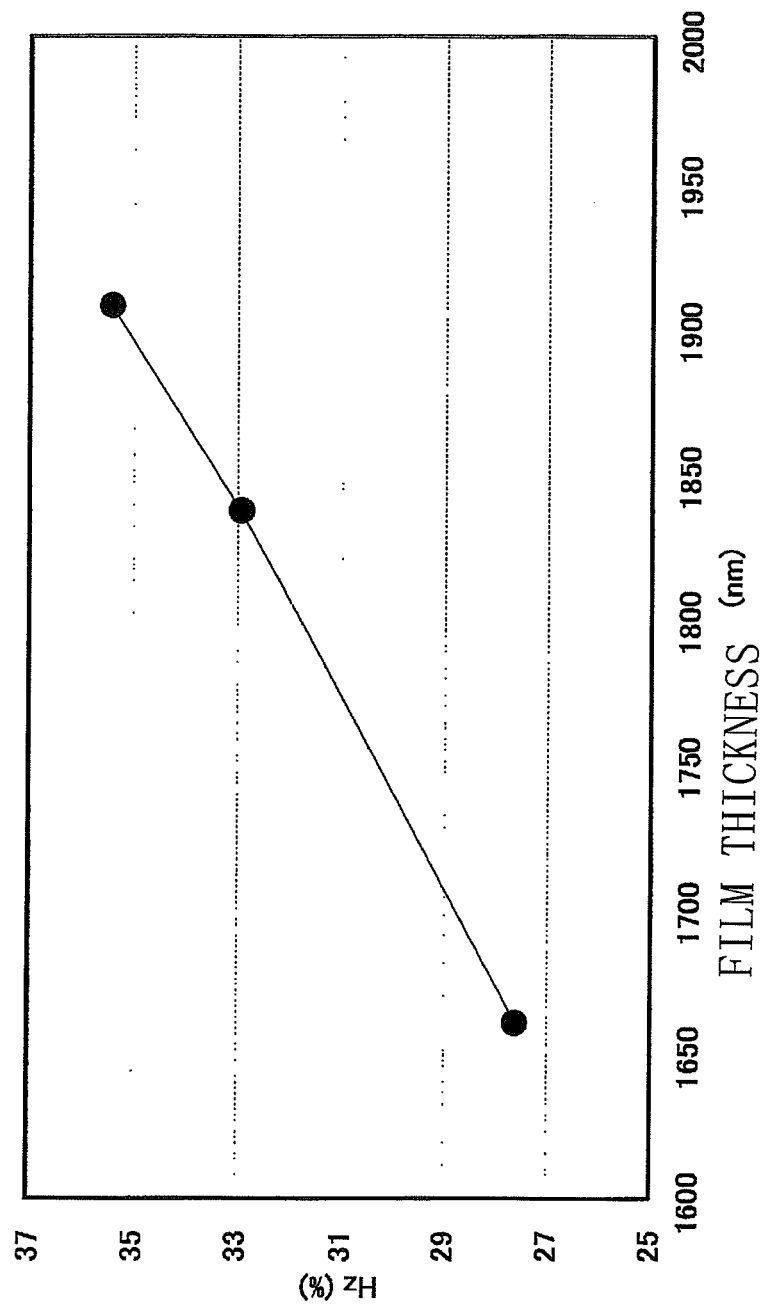
FIG. 6 is a correlation diagram between a film thickness and a haze ratio of a transparent electrode layer, obtained in Reference Examples 1 to 3 of the present invention.

FIG. 6 is a correlation diagram between the average film thickness and the haze ratio of the transparent electrode layer, obtained from the results of Reference Example 1 to 3. FIG. 6 shows that changing the film thickness of the transparent electrode layer from 1661 to 2078 nm leads to an increase in irregularities, and an increase in haze ratio from 27.6% to 35.4%. It can be said therefrom that a grain size becomes larger with an increase in film thickness of the transparent electrode layer, thus leading to the increased irregularities.

Figure 7:
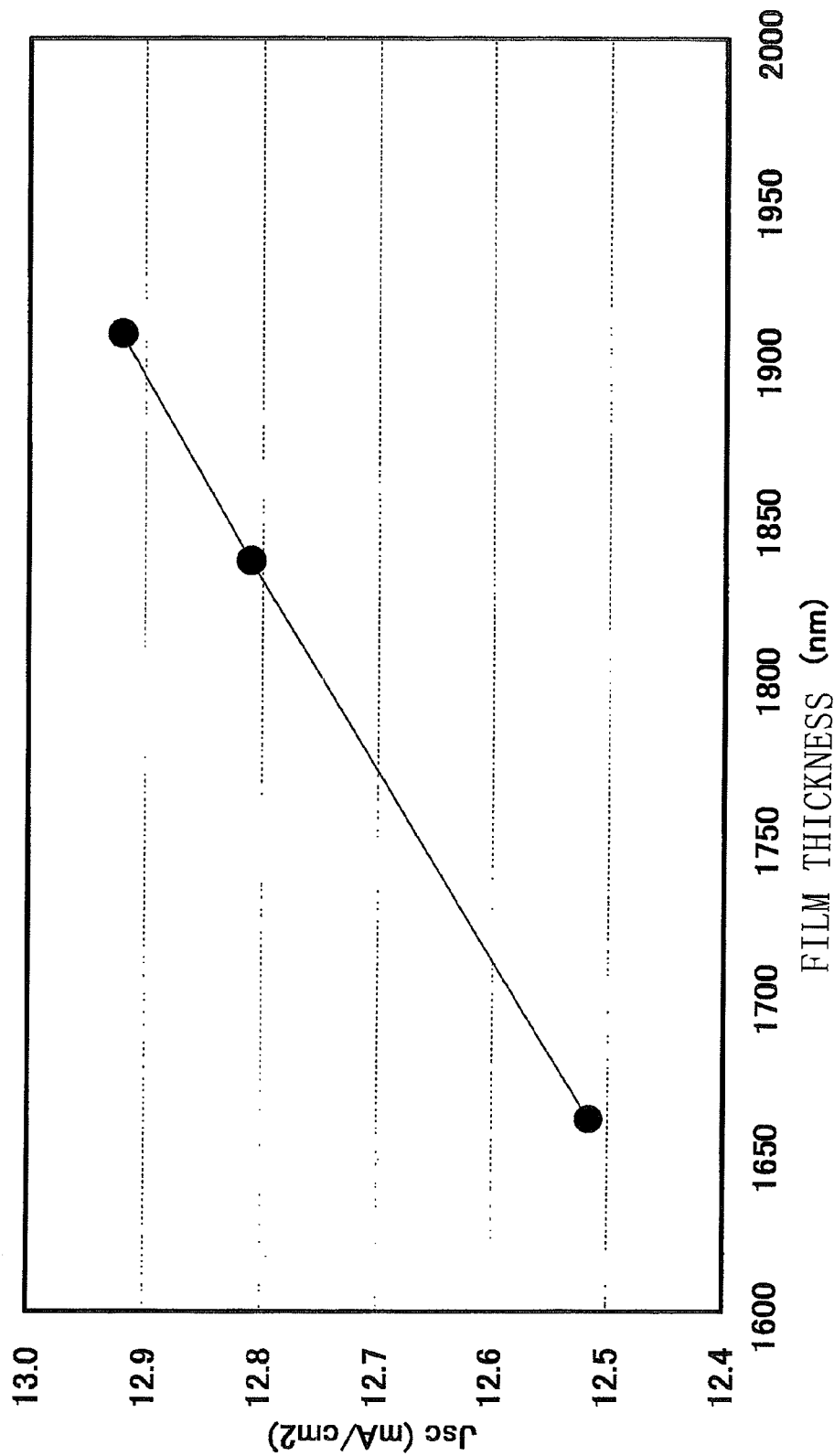
FIG. 7 is a correlation diagram between a film thickness of the transparent electrode layer and a short-circuit current value, obtained in Reference Examples 4 to 6 of the present invention.

Further, FIG. 7 is a correlation diagram between the average film thickness of the transparent electrode layer and the short-circuit current density (Jsc) of the thin film photoelectric conversion device, which were obtained from Reference Examples 4 to 6. Increasing the film thickness of the transparent electrode layer from 1661 to 1907 nm leads to an increase in Jsc from 12.52 to 12.92 mA/cm$^2$. That is, it can be said in this case that, when the film thickness of the transparent electrode layer increases, an increase in generation current due to the light confinement effect associated with an increased haze ratio is larger than a decrease in generation current due to an increased absorption loss of the transparent electrode layer, thereby increasing the Jsc of the thin film photoelectric conversion device.

Comparative Example 1

Figure 8:
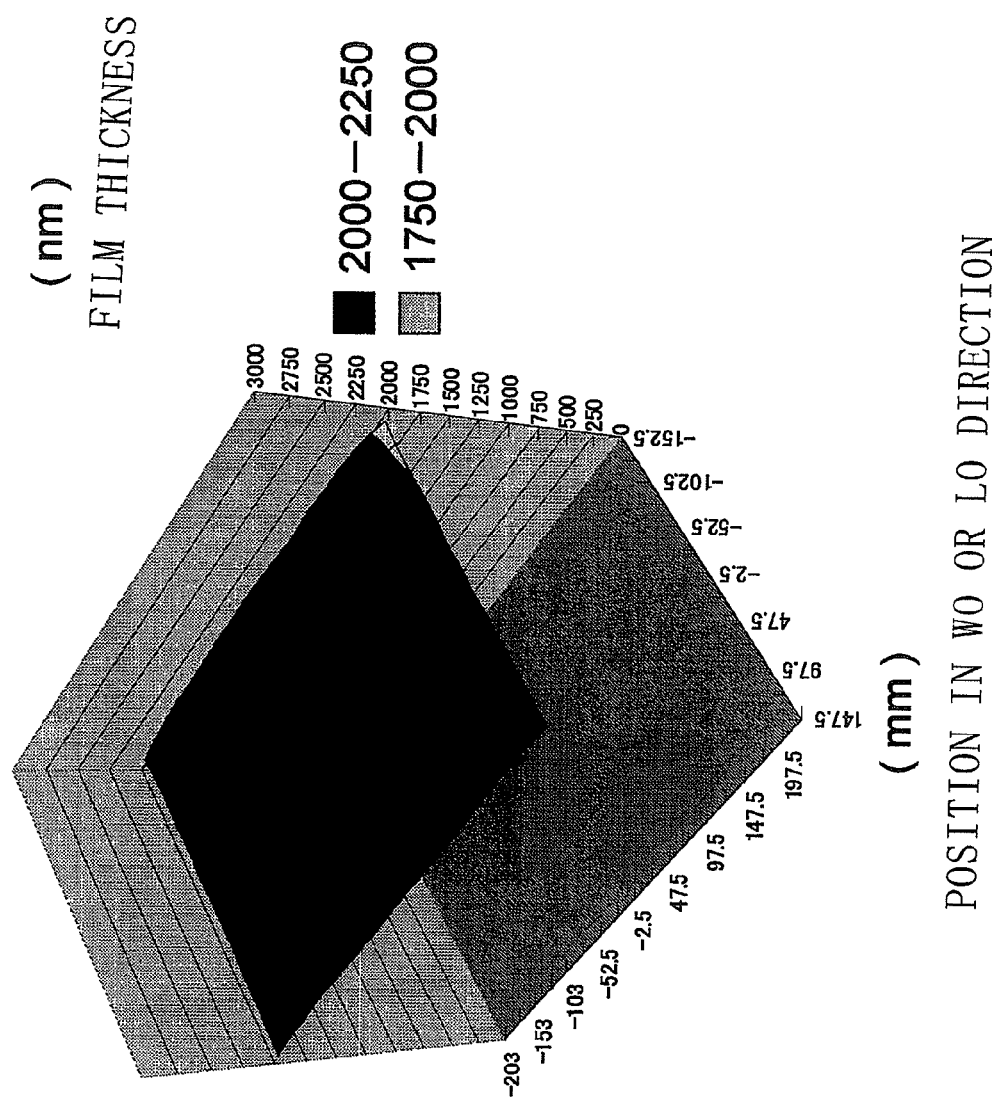
FIG. 8 is a film thickness distribution of a transparent electrode layer in Comparative Example 1 of a conventional method.

As Comparative Example 1 of the conventional method, an integrated-type thin film photoelectric conversion device was produced. In a similar manner as in Reference Example 1 except for a different substrate size of 360×465 mm and 4 mm in thickness, the transparent electrode layer 12 made of ZnO was formed on the transparent substrate 1 as a glass substrate by a low-pressure thermal CVD method, to produce the substrate 1 for a thin film photoelectric conversion device. The substrate was arranged with its 465-mm-direction aligned to the W0 direction of the heaters and its 360-mm-direction aligned to the L0 direction of the heaters, to form the transparent electrode layer 12. Heaters with W0 of 600 mm and L0 of 500 mm were used. Outputs of the heaters H1 to H6 were adjusted so that any of the substrate temperatures T1 to T6 were set to 150° C. FIG. 8 shows a film thickness distribution of the transparent electrode layer, which was obtained from interference of a reflection spectrum by light incident from the transparent electrode layer 12 side. Measurement was performed at 221 points (=13×17 points) with intervals of 25 mm on the substrate of 360×465 mm. An average value of film thicknesses Zt was 2052 nm, a deviation of the film thickness was ±3.4%, and a distribution thereof was uniform. An increasing rate ΔZt of the film thickness of the transparent electrode layer along the straight line $X_1$ drawn at right angles from the center $X_0$ of the substrate toward the side of the substrate was −0.090%/cm along the line from $X_0$ toward $X_{1+}$ and was −0.051%/cm along the line from $X_0$ toward X. ΔZt along the straight line $X_2$ drawn at right angles from the center $X_0$ of the substrate toward the side of the substrate was 0.087%/cm along the line from $X_0$ toward $X_{2+}$ and was 0.17%/cm along the line from $X_0$ toward $X_{2-}$. In other words, since an absolute value of ΔZt of Comparative Example 1 is 0.17%/cm at the maximum and not more than 0.2%/cm, ΔZt can be regarded as being nearly equal to zero (ΔZt≈0). Hereinafter, if not otherwise specified, an increasing rate ΔZ of a film thickness is representatively shown by one with its absolute value being maximal in the case of drawing line segments X at right angles from the center of the substrate toward the four sides thereof. Further, a haze ratio measured using the illuminant C of Comparative Example 1 was 34.6 to 38.4%, which was almost constant, and an average was 36.6%.

On the obtained substrate 1 for a thin film photoelectric conversion device, the photoelectric conversion unit 6 made up of the amorphous silicon photoelectric conversion unit 2 and the crystalline silicon photoelectric conversion unit 3 was formed, and the back electrode layer 4 was further formed, to produce a stacked-type thin film photoelectric conversion device. At that time, the integrated-type thin film photoelectric conversion device 901 having the structure shown in FIG. 2 was formed by laser scribing. A length of the substrate in the direction of the straight line $X_1$ shown in FIG. 1 was 465 mm, a length of the substrate in the direction of the straight line $X_2$ was 360 mm, and the photoelectric conversion cells are connected in series in 47 columns in the direction of the straight line X.

Specifically, the integrated-type thin film photoelectric conversion device 901 was formed as follows. Using a YAG laser with a wavelength of 1064 nm, the first separation groove 903 was formed in the transparent electrode layer 12, followed by washing and drying.

Next, on the transparent electrode layer 12, the amorphous photoelectric conversion unit as the front photoelectric conversion unit 2 was formed using a plasma enhanced CVD method, the unit including: the one-conductivity-type layer 21 made up of a p-type microcrystalline silicon layer with a setting film thickness of 10 nm and a p-type amorphous silicon carbide layer with a setting film thickness of 15 nm; the photoelectric conversion layer 22 made of an intrinsic amorphous silicon layer with a setting film thickness of 350 nm; and the opposite-conductivity-type layer 23 made of an n-type microcrystalline silicon layer with a setting film thickness of 15 nm.

Subsequently, the crystalline silicon photoelectric conversion unit as the back photoelectric conversion unit 3 was sequentially formed by a plasma enhanced CVD method, the unit including: the one-conductivity-type layer 31 made of a p-type microcrystalline silicon layer with a setting film thickness of 15 nm; the photoelectric conversion layer 32 made of an intrinsic crystalline silicon layer with a setting film thickness of 2.5 μm; and the opposite-conductivity-type layer 33 made of an n-type microcrystalline silicon layer with a setting film thickness of 15 nm.

Figure 9:
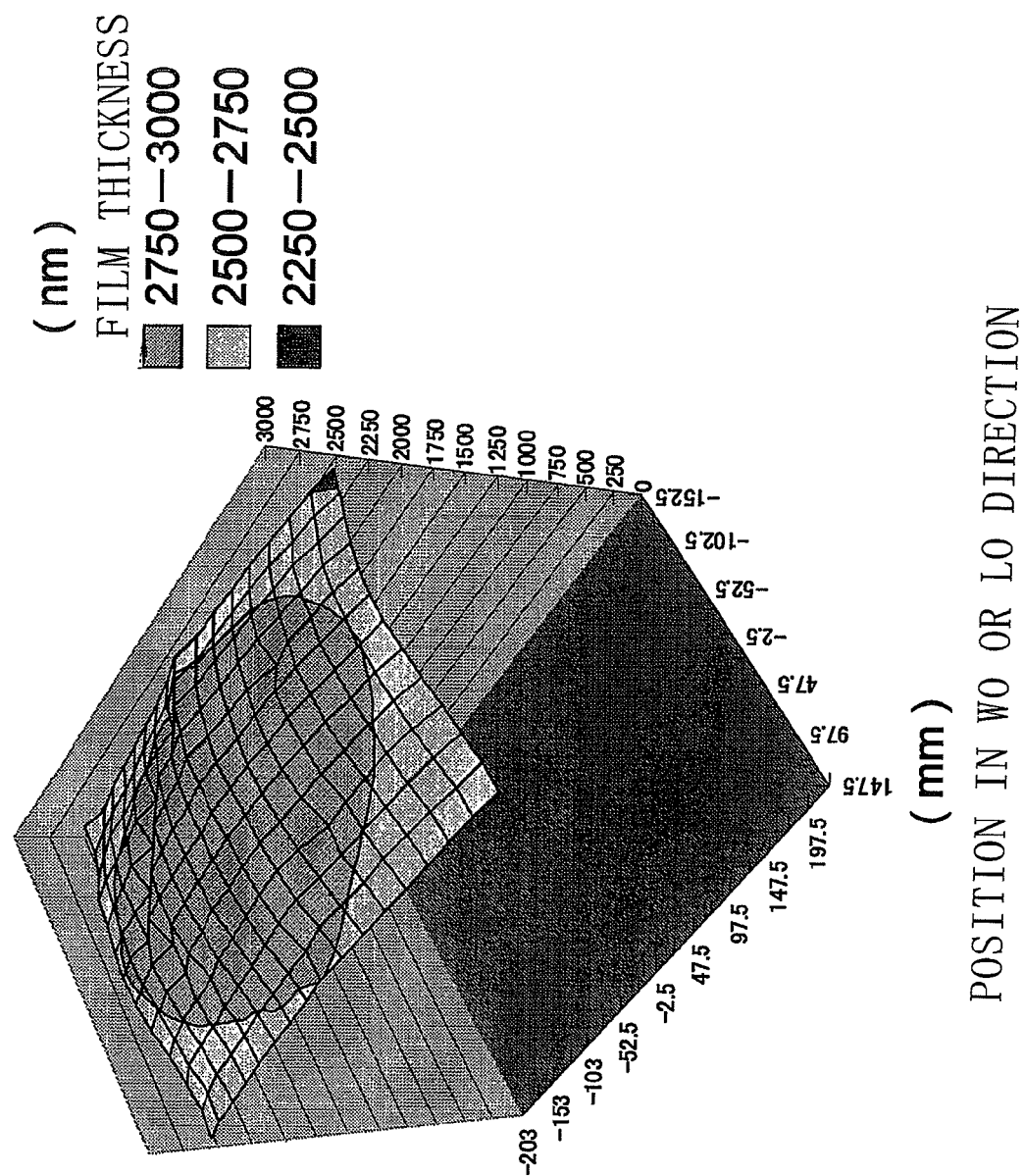
FIG. 9 is a film thickness distribution of a photoelectric conversion unit in Comparative Example 1 of the conventional method.

After formation of the photoelectric conversion unit 6 made up of the front photoelectric conversion unit 2 and the back photoelectric conversion unit 3, light is made incident from the photoelectric conversion unit 6 side, to measure a film thickness Zs of the photoelectric conversion unit 6 from interference of a reflection spectrum. Measurement was performed at 221 points (=13×17 points) with intervals of 25 mm on the substrate of 360×465 mm. FIG. 9 shows a film thickness distribution of the photoelectric conversion unit. An average value of film thicknesses Zs was 2754 nm, a deviation of the film thickness was ±9.6%, and a distribution thereof was upwardly projected with a larger thickness at the central portion and a smaller thickness at the peripheral portion. In the case of drawing line segments X at right angles from the center of the substrate toward the four sides thereof, an increasing rate ΔZs of the film thickness of the photoelectric conversion unit was −0.43 to −0.60%/cm, and along the line segment from $X_0$ toward $X_{1+}$, its absolute value was −0.60%/cm at the maximum and its sign was negative.

Next, using a YAG laser with a second harmonic of 532 nm, the connection groove 905 was formed penetrating the front photoelectric conversion unit 2 and the back photoelectric conversion unit 3.

Next, as the back electrode layer 4, the conductive oxide layer 41 of ZnO having a thickness of 90 nm and doped with Al, and the metal layer 42 of Ag having a thickness of 200 nm were sequentially formed by a sputtering method.

Finally, using the YAG laser with a second harmonic of 532 nm, the second separation groove 904 was formed penetrating the front photoelectric conversion unit 2, the back photoelectric conversion unit 3 and the back electrode layer 4.

The integrated-type thin film photoelectric conversion device 901 as thus obtained was irradiated with light of Air Mass 1.5 (AM 1.5) having a light amount of 100 mW/cm², and output characteristics were measured in terms of per unit area and one column of the photoelectric conversion cell, to obtain a Jsc of 11.89 mA/cm², an open-circuit voltage (Voc) of 1.334 V, a fill factor (FF) of 0.703, and a conversion efficiency (Eff) of 11.16%.

In Comparative Example 1, a film thickness increasing rate ΔZt of the transparent electrode layer is nearly equal to zero (ΔZt≈0), a film thickness increasing rate ΔZs of the photoelectric conversion unit is equal to −0.60%/cm (ΔZs=−0.60%/cm), and it cannot thus be said that signs of ΔZt and ΔZs are different. The Jsc is limited by the thinner peripheral portion of the photoelectric conversion unit, and is smaller by about 1 mA/cm² than in the case of the small-area thin film photoelectric conversion cell of a 10 mm square of Reference Example 6.

Comparative Example 2

As Comparative Example 2, an integrated-type thin film photoelectric conversion device similar to Comparative Example 1 was produced. The same production method and structure as those of Comparative Example 1 were employed except for the difference in conditions for producing the transparent electrode layer 12. Specifically, the method for producing the integrated-type thin film photoelectric conversion device was made the same as for Comparative Example 1 except that at the time of producing the transparent electrode layer 12, the substrate temperatures T1 to T4 at the end portions were set to 150° C., T5 to 152.5° C., and T6 at the central portion to 155° C.

A film thickness distribution of the obtained transparent electrode layer 12 is almost symmetrical and upwardly projected, a film thickness at the position of the central portion $X_0$ is as large as 2271 nm, and a film thickness at the position of the end portion $X_{1+}$ is as small as 2075 nm. An increasing rate ΔZt from the central portion $X_0$ toward the end portion $X_{1+}$ was −0.43%/cm. Further, haze ratios of the central portion and the end portion were 50.6% and 40.7%, respectively.

Using the obtained substrate 1 for a thin film photoelectric conversion device, the integrated-type thin film photoelectric conversion device 901 with a similar structure to that of Comparative Example 1 was produced. The film thickness distribution was made so as to be upwardly projected as in Comparative Example 1, and an increasing rate ΔZs from the central portion $X_0$ toward the end portion $X_{1+}$ was −0.59%/cm. Output characteristics of the obtained integrated-type thin film photoelectric conversion device 901 were measured in a similar manner as in Comparative Example 1, to obtain a Jsc of 11.36 mA/cm², an open-circuit voltage (Voc) of 1.342 V, a fill factor (FF) of 0.709, and a conversion efficiency (Eff) of 10.81%.

In Comparative Example 2, a film thickness increasing rate ΔZt of the transparent electrode layer is equal to −0.43%/cm (ΔZt=−0.43%/cm), a film thickness increasing rate ΔZs of the photoelectric conversion unit is equal to −0.59%/cm (ΔZs=−0.59%/cm), and signs of ΔZt and ΔZs are thus both negative. At the peripheral portion, the light confinement effect is low due to the small thickness of the transparent electrode layer, and a generation current is further lower than in Comparative Example 1 due to the small film thickness of the photoelectric conversion unit, leading to stronger limitation on the Jsc at the peripheral portion. Therefore, the Jsc in Comparative Example 2 is small as compared with Comparative Example 1.

Example 1

As Example 1, an integrated-type thin film photoelectric conversion device similar to Comparative Example 1 was produced. The same production method and structure as those of Comparative Example 1 were employed except for the difference in conditions for producing the transparent electrode layer 12. Specifically, the method for producing the integrated-type thin film photoelectric conversion device was made the same as for Comparative Example 1 except that at the time of producing the transparent electrode layer 12, the substrate temperatures T1 to T4 at the end portions were set to 153° C., T5 to 151° C., and T6 at the central portion to 150° C.

Figure 10:
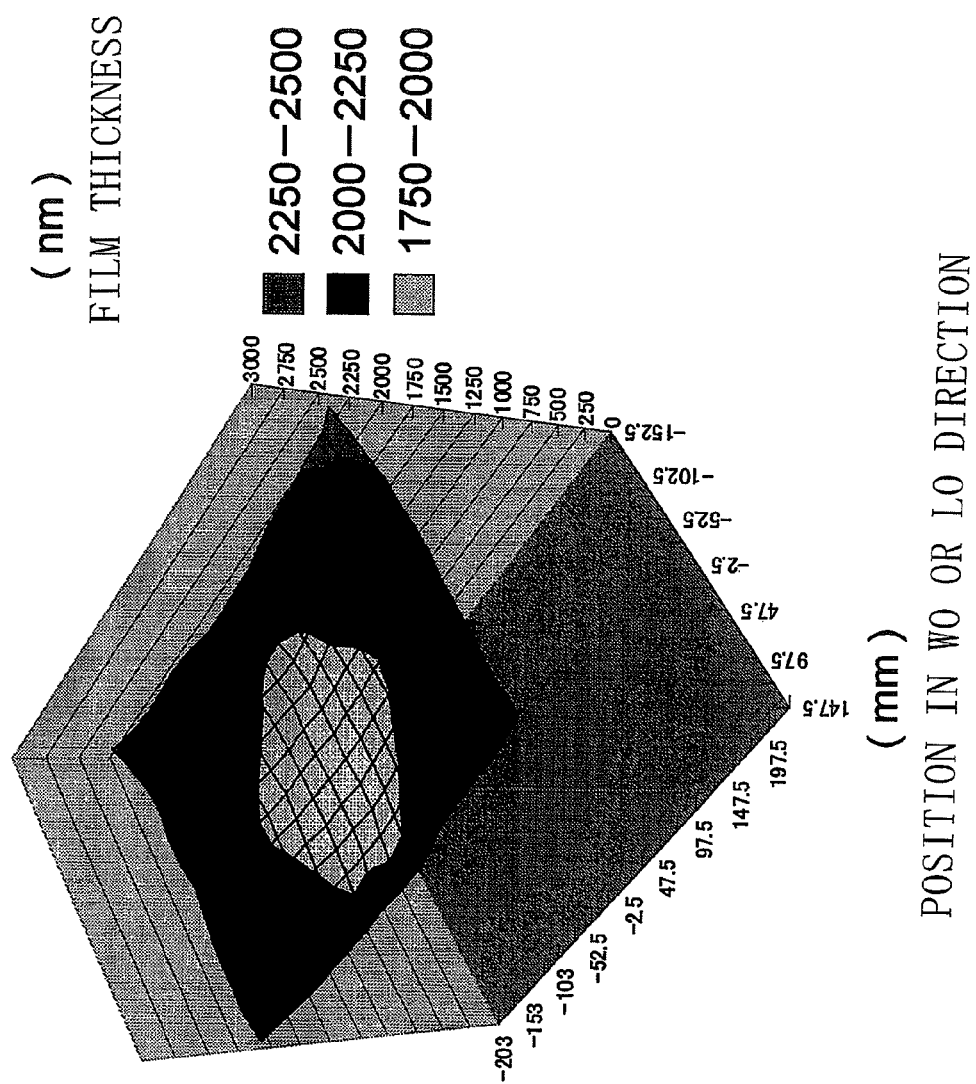
FIG. 10 is a film thickness distribution of a transparent electrode layer in Example 1 of the present invention.

FIG. 10 shows a film thickness distribution of the obtained transparent electrode layer 12. A film thickness distribution is almost symmetrical and downwardly projected, a film thickness at the position of the central portion $X_0$ is as small as 1931 nm, and a film thickness at the position of the end portion $X_{1+}$ is as large as 2203 nm. An increasing rate $\Delta Zt$ from the central portion $X_0$ toward the end portion $X_{1+}$ was 0.70%/cm. Further, haze ratios of the central portion and the end portion were 37.5% and 46.3%, respectively.

Using the obtained substrate 1 for a thin film photoelectric conversion device, the integrated-type thin film photoelectric conversion device 901 with a similar structure to that of Comparative Example 1 was produced. The film thickness distribution of the photoelectric conversion unit was made so as to be upwardly projected as in Comparative Example 1, and an increasing rate $\Delta Zs$ from the central portion $X_0$ toward the end portion $X_{1+}$ was −0.62%/cm. Output characteristics of the obtained integrated-type thin film photoelectric conversion device 901 were measured in a similar manner as in Comparative Example 1, to obtain a Jsc of 12.53 mA/cm², an open-circuit voltage (Voc) of 1.341 V, a fill factor (FF) of 0.710, and a conversion efficiency (Eff) of 11.93%.

In Example 1, a film thickness increasing rate $\Delta Zt$ of the transparent electrode layer is equal to 0.70%/cm ($\Delta Zt=0.70\%$/cm), a film thickness increasing rate $\Delta Zs$ of the photoelectric conversion unit is equal to −0.62%/cm ($\Delta Zs=-0.62\%$/cm), and signs of $\Delta Zt$ and $\Delta Zs$ are thus different. In this Example, at the peripheral portion, a decrease in generation current due to the small film thickness of the photoelectric conversion unit is compensated by the light confinement effect generated due to the large film thickness of the transparent electrode layer, thereby to suppress the limitation on the Jsc at the peripheral portion. Therefore, the Jsc in Example 2 is large as compared with Comparative Examples 1, 2.

Example 2

Figure 11:
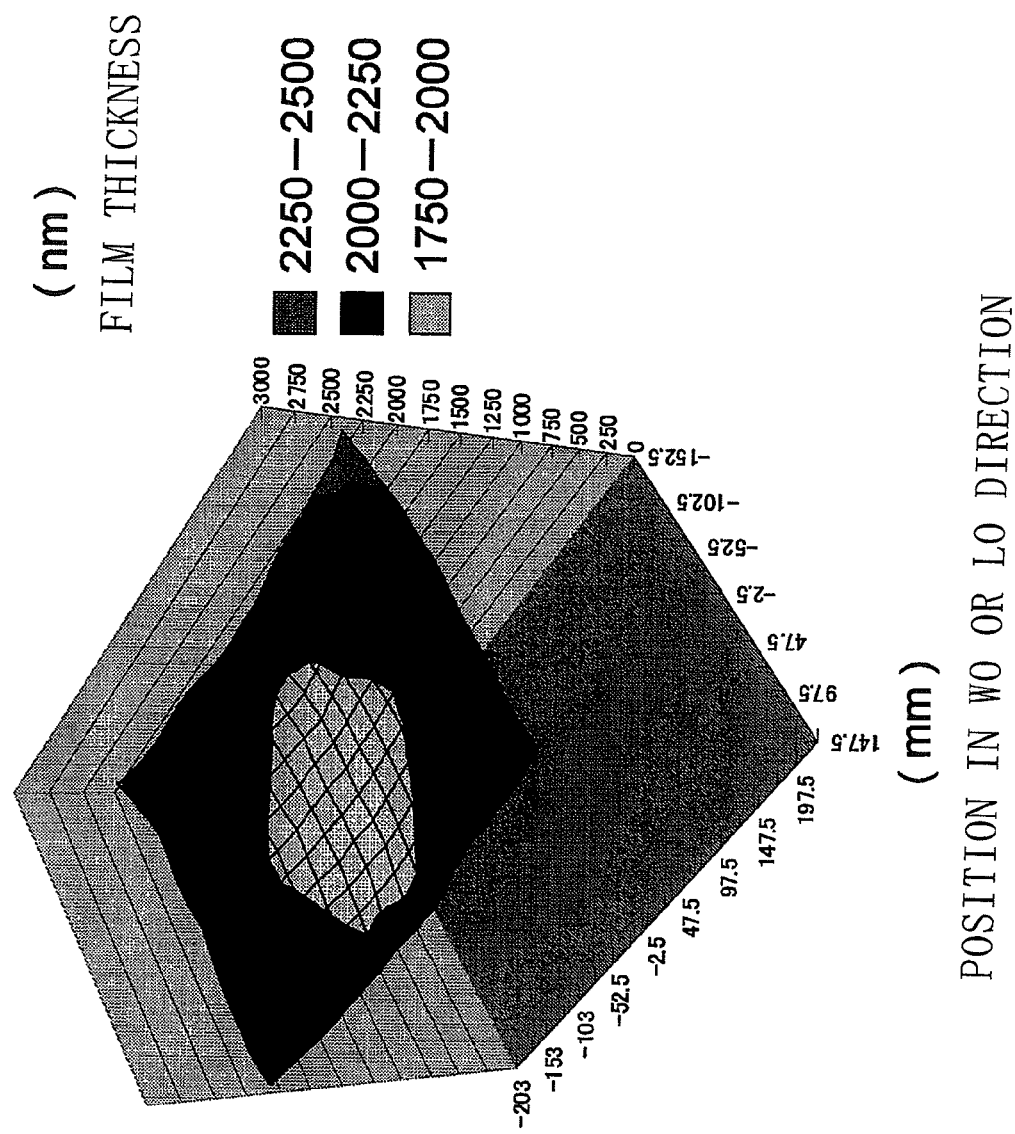
FIG. 11 is a film thickness distribution of a transparent electrode layer in Example 2 of the present invention.

As Example 2, an integrated-type thin film photoelectric conversion device similar to Comparative Example 1 was produced. The same production method and structure as those of Comparative Example 1 were employed except for the difference in conditions for producing the transparent electrode layer 12. Specifically, the method for producing the integrated-type thin film photoelectric conversion device was made the same as for Comparative Example 1 except that at the time of producing the transparent electrode layer 12, the substrate temperatures T1 to T4 at the end portions were set to 155° C., T5 to 152.5° C., and T6 at the central portion to 150° C. FIG. 11 shows a film thickness distribution of the obtained transparent electrode layer 12. A film thickness distribution is almost symmetrical and downwardly projected, a film thickness at the position of the central portion $X_0$ is as small as 1979 nm, and a film thickness at the position of the end portion $X_{1+}$ is as large as 2298 nm. An increasing rate $\Delta Zt$ from the central portion $X_0$ toward the end portion $X_{1+}$ was 0.81%/cm. Further, haze ratios of the central portion and the end portion were 39.5% and 51.7%, respectively.

Using the obtained substrate 1 for a thin film photoelectric conversion device, the integrated-type thin film photoelectric conversion device 901 with a similar structure to that of Comparative Example 1 was produced. In this Example, the film thickness distribution of the photoelectric conversion unit was made so as to be upwardly projected as in Comparative Example 1, and an increasing rate $\Delta Zs$ from the central portion $X_0$ toward the end portion $X_{1+}$ was −0.60%/cm. Output characteristics of the obtained integrated-type thin film photoelectric conversion device 901 were measured in a similar manner as in Comparative Example 1, to obtain a Jsc of 13.25 mA/cm², an open-circuit voltage (Voc) of 1.337 V, a fill factor (FF) of 0.705, and a conversion efficiency (Eff) of 12.49%.

In Example 2, a film thickness increasing rate $\Delta Zt$ of the transparent electrode layer is equal to 0.81%/cm ($\Delta Zt=0.81\%$/cm), a film thickness increasing rate $\Delta Zs$ of the photoelectric conversion unit is equal to −0.60%/cm ($\Delta Zs=-0.60\%$/cm), and signs of $\Delta Zt$ and $\Delta Zs$ are thus different. In this Example, at the peripheral portion, the transparent electrode layer has a further larger thickness than in Example 1, to enhance the light confinement effect, thereby further suppressing the limitation on the Jsc at the peripheral portion. Therefore, the Jsc in Example 2 is further large as compared with Example 1.

Example 3

As Example 3, an integrated-type thin film photoelectric conversion device similar to Comparative Example 2 was produced. The same production method and structure as those of Comparative Example 2 were employed except that a pressure at the time of forming the photoelectric conversion layer 32 as the intrinsic crystalline silicon layer with a thickness of 2.5 μm was decreased to two-thirds of that in Comparative Example 2.

A film thickness distribution of the obtained transparent electrode layer 12 is almost symmetrical and upwardly projected, a film thickness at the position of the central portion $X_0$ is as large as 2275 nm, and a film thickness at the position of the end portion $X_{1+}$ is as small as 2070 nm. An increasing rate $\Delta Zt$ from the central portion $X_0$ toward the end portion $X_{1+}$ was −0.45%/cm. Further, haze ratios of the central portion and the end portion were 51.0% and 40.4%, respectively.

Using the obtained substrate 1 for a thin film photoelectric conversion device, the integrated-type thin film photoelectric conversion device 901 with a similar structure to that of Comparative Example 2 was produced. An average value of film thicknesses Zs was 2732 nm, a deviation of the film thickness was ±10.5%, and a distribution thereof was downwardly projected with a smaller thickness at the central portion and a larger thickness at the peripheral portion. An increasing rate $\Delta Zs$ from the central portion $X_0$ toward the end portion $X_{1+}$ was 0.49%/cm, and a sign was positive. Output characteristics of the obtained integrated-type thin film photoelectric conversion device 901 were measured in a similar manner as in Comparative Example 1, to obtain a Jsc of 13.02 mA/cm², an open-circuit voltage (Voc) of 1.339 V, a fill factor (FF) of 0.706, and a conversion efficiency (Eff) of 12.31%.

In Example 3, a film thickness increasing rate $\Delta Zt$ of the transparent electrode layer is equal to −0.45%/cm ($\Delta Zt=-0.45\%$/cm), a film thickness increasing rate $\Delta Zs$ of the photoelectric conversion unit is equal to −0.49%/cm ($\Delta Zs=-0.49\%$/cm), and signs of $\Delta Zt$ and $\Delta Zs$ are thus different. In this Example, at the central portion, a decrease in generation current due to the small film thickness of the photoelectric conversion unit is compensated by the light confinement effect generated due to the large film thickness of the transparent electrode layer, thereby to suppress the limitation on the Jsc at the central portion. Therefore, the value of the Jsc in Example 3 was shown as high as 13.02 mA/cm².

Comparative Example 3

As Comparative Example 3, an integrated-type thin film photoelectric conversion device similar to Comparative Example 1 was produced. The same production method and structure as those of Comparative Example 1 were employed except that the size of the substrate was 1400×1000 mm and 5 mm in thickness, and the size of the heaters of the low-pressure thermal CVD device was a size with W0 of 1800 mm and L0 of 1500 mm, which was about three times as large roughly in proportion to the size of the substrate. The sizes of the respective heaters H1 to H6 were also made about three times as large. The substrate temperatures T1 to T6 were set to 150° C., to produce the transparent electrode layer 12. The straight line $X_1$ was drawn in the 1400-mm-direction and the straight line $X_2$ in the 1000-mm-direction.

An average value of film thicknesses Zt of the transparent electrode layer was 2078 nm, a deviation of the film thickness was ±9.8%, and a distribution thereof was uniform. An increasing rate ΔZt of the film thickness of the transparent electrode layer along the straight line $X_1$ drawn from the central portion $X_0$ toward the side of the substrate at right angles was 0.14%/cm, and ΔZt was nearly equal to zero (ΔZt≈0) along the line from $X_0$ toward $X_{1+}$. A haze ratio was 40.7±5%.

Using the obtained substrate 1 for a thin film photoelectric conversion device, the integrated-type thin film photoelectric conversion device 901 with a similar structure to that of Comparative Example 1 was produced. However, the photoelectric conversion cells were connected in series in 150 columns in the 1400-mm-direction. An average value of film thicknesses Zs of the photoelectric conversion unit was 2630 nm, a deviation of the film thickness was ±12.3%, and a distribution thereof was upwardly projected with a larger thickness at the central portion and a smaller thickness at the peripheral portion. ΔZs along the line from $X_0$ toward $X_{1+}$ was −0.25%/cm, and a sign was thus negative.

Output characteristics of the obtained integrated-type thin film photoelectric conversion device 901 were measured in a similar manner as in Comparative Example 1, to obtain a Jsc of 11.63 mA/cm², an open-circuit voltage (Voc) of 1.305 V, a fill factor (FF) of 0.698, and a conversion efficiency (Eff) of 10.59%.

In Comparative Example 3, a film thickness increasing rate ΔZt of the transparent electrode layer is nearly equal to zero (ΔZt≈0), a film thickness increasing rate ΔZs of the photoelectric conversion unit is equal to −0.25%/cm (ΔZs=−0.25%/cm), and it cannot thus be said that signs of ΔZt and ΔZs are different. In this Comparative Example, the Jsc is limited by the thinner peripheral portion of the photoelectric conversion unit, and is smaller by not less than 1 mA/cm² than in Reference Example 6.

Example 4

As Example 4, an integrated-type thin film photoelectric conversion device similar to Comparative Example 3 was produced. The same production method and structure as those of Comparative Example 3 were employed except for the difference in conditions for producing the transparent electrode layer 12. Specifically, the method for producing the integrated-type thin film photoelectric conversion device was made the same as for Comparative Example 3 except that at the time of producing the transparent electrode layer 12, the substrate temperatures T1 to T4 at the end portions were set to 155° C., T5 to 152.5° C., and T6 at the central portion to 150° C. A film thickness distribution is almost symmetrical and downwardly projected, a film thickness at the position of the central portion $X_0$ is as small as 2075 nm, and a film thickness at the position of the end portion is as large as 2475 nm. An increasing rate ΔZt from the central portion $X_0$ toward the end portion $X_{1+}$ was 0.27%/cm. Further, haze ratios of the central portion and the end portion were 40.8% and 59.5%, respectively.

Using the obtained substrate 1 for a thin film photoelectric conversion device, the integrated-type thin film photoelectric conversion device 901 with a similar structure to that of Comparative Example 3 was produced. An average value of film thicknesses Zs of the photoelectric conversion unit was 2650 nm, a deviation of the film thickness was ±12.0%, and a distribution thereof was upwardly projected with a larger thickness at the central portion and a smaller thickness at the peripheral portion. ΔZt along the line from $X_0$ toward $X_{1+}$ was −0.24%/cm, and a sign was thus negative.

Output characteristics of the obtained integrated-type thin film photoelectric conversion device 901 were measured in a similar manner as in Comparative Example 3, to obtain a Jsc of 12.93 mA/cm², an open-circuit voltage (Voc) of 1.307 V, a fill factor (FF) of 0.704, and a conversion efficiency (Eff) of 11.90%.

In Example 4, despite the large area of 1400×1000 mm, the value of the Jsc was shown as high a value as 12.93 mA/cm², and Eff was 11.90%, indicating improved characteristics.

A film thickness increasing rate ΔZt of the transparent electrode layer is equal to 0.27%/cm (ΔZt=0.27%/cm), a film thickness increasing rate ΔZs of the photoelectric conversion unit is equal to −0.24%/cm (ΔZs=−0.24%/cm), and signs of ΔZt and ΔZs are thus different. In this Example, at the peripheral portion, the transparent electrode layer is further larger than in Comparative Example 3, to enhance the light confinement effect, thereby further suppressing the limitation on the Jsc at the peripheral portion. Hence it can be said that in Example 4, the value of the Jsc was shown high despite the large area of 1400×1000 mm.

Example 5

Figure 12:
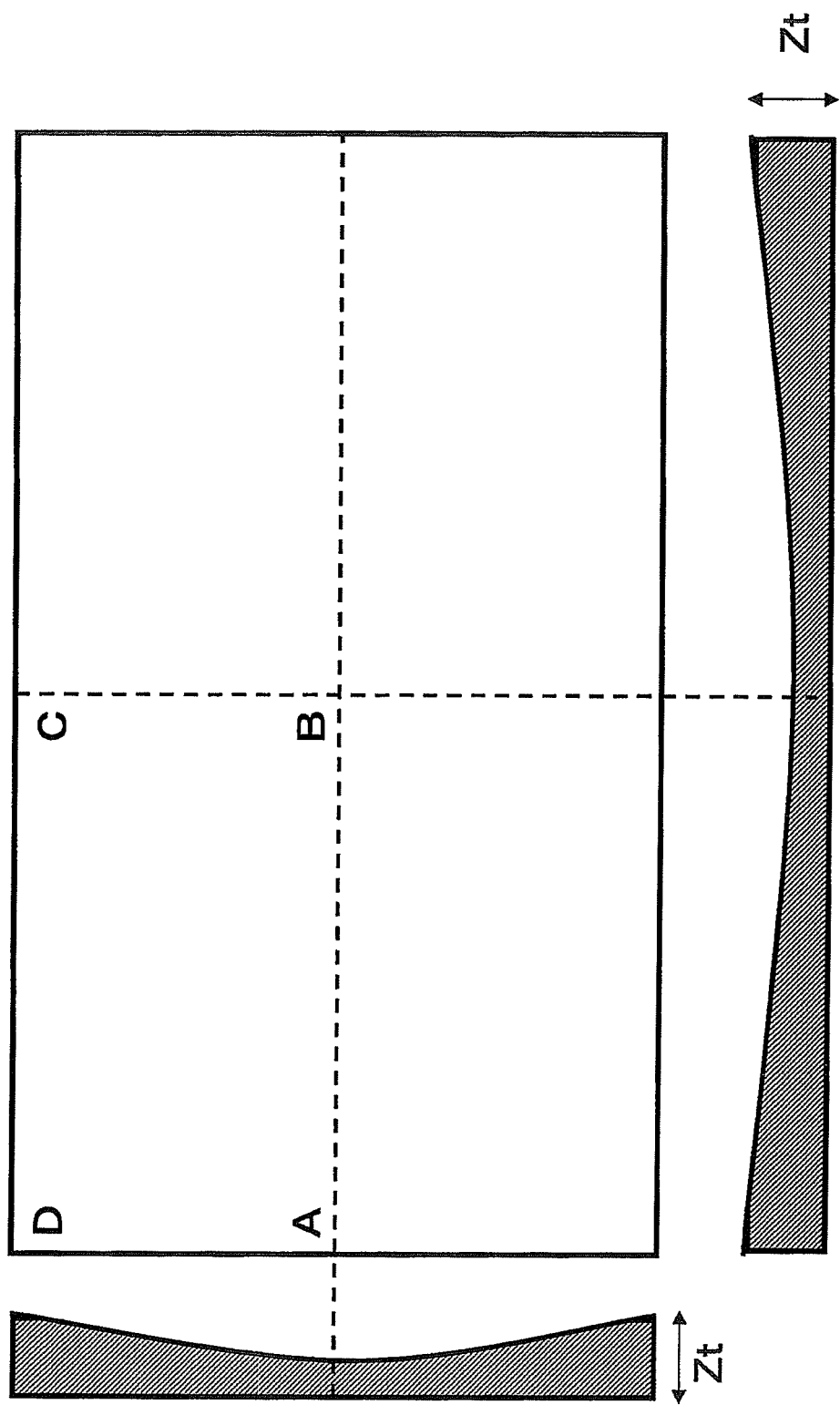
FIG. 12 is a plan view and a cross-sectional view of an integrated-type thin film photoelectric conversion device obtained in Example 5 of the present invention.

As Example 5, as shown in FIG. 12, the thin film photoelectric conversion device obtained in Example 4 was divided into four integrated-type thin film photoelectric conversion devices. In one of the integrated-type thin film photoelectric conversion devices obtained by the quartering, a film thickness of the transparent electrode layer was 2461 nm and a haze ratio thereof was 58.1% near a corner A, a film thickness was 2081 nm and a haze ratio was 41.2% near a corner B, a film thickness was 2435 nm and a haze ratio was 57.3% near a corner C, and a film thickness was 2520 nm and a haze ratio was 59.9% near a corner D. When the line segment X was drawn from the corner B toward the corner A, ΔZt was 0.26%/cm, and a sign was thus positive.

Further, in the above integrated-type thin film photoelectric conversion device, a film thickness of the photoelectric conversion unit near the corner A was 2652 nm, a film thickness near the corner B was 3180 nm, a film thickness near the corner C was 2670 nm, and a film thickness near the corner D was 2332 nm. When the line segment X was drawn from the corner B toward the corner A, ΔZs was −0.24%/cm, and a sign was thus negative.

Output characteristics of the obtained integrated-type thin film photoelectric conversion device 901 were measured in a similar manner as in Comparative Example 3, to obtain a Jsc of 13.02 mA/cm$^2$, an open-circuit voltage (Voc) of 1.323 V, a fill factor (FF) of 0.705, and a conversion efficiency (Eff) of 12.14%.

Even in the case of dividing the substrate as in Example 5, when signs of ΔZt and ΔZs are different along at least one line segment X parallel to the substrate, a decrease in generation current in the portion of the photoelectric conversion unit having a small film thickness can be compensated by an increase in light confinement effect generated by making the transparent electrode layer have a larger thickness, to prevent the generation current from being limited so as to make the Jsc high.

DESCRIPTION OF REFERENCE NUMERALS

1 Substrate for thin film photoelectric conversion device
11 Transparent substrate
12 Transparent electrode layer
2 Front photoelectric conversion unit
21 One-conductivity-type layer
22 Photoelectric conversion layer
23 Opposite-conductivity-type layer
3 Back photoelectric conversion unit
31 One-conductivity-type layer
32 Photoelectric conversion layer
33 Opposite-conductivity-type layer
4 Back electrode layer
41 Conductive oxide layer
42 Metal layer
5 Thin film photoelectric conversion device
6 Photoelectric conversion unit
901 Integrated-type thin film photoelectric conversion device
902 Photoelectric conversion cell
903 First separation groove
904 Second separation groove
905 Connection groove

The invention claimed is:

1. A thin film photoelectric conversion device, comprising:
a substrate, a transparent electrode layer, a photoelectric conversion unit, and a back electrode layer, wherein the transparent electrode layer is arranged between the substrate and photoelectric conversion unit and the photoelectric conversion unit is arranged between the transparent electrode layer and the back electrode layer;
wherein one line segment in a parallel direction to a main surface of the substrate is taken as X, the film thickness of the transparent electrode layer is taken as Zt, the film thickness of the photoelectric conversion unit is taken as Zs, the change in thickness Zt with respect to a length extending parallel to X is taken as ΔZt, and the change in thickness Zs with respect to a length extending parallel to X is taken as ΔZs,
wherein, when measured along X between the center and an end portion of the device over an interval of 5 mm to 100 mm, the ΔZt is continuously positive and ΔZs is continuously negative or ΔZt is continuously negative and ΔZs is continuously positive.

2. The thin film photoelectric conversion device according to claim 1, wherein
the film thickness Zt of the transparent electrode layer is larger at a peripheral portion of the substrate as compared with a central portion thereof and the film thickness Zs of the photoelectric conversion unit is smaller at the peripheral portion of the substrate as compared with the central portion thereof, and absolute values of ΔZt and ΔZs are more than 0.2%/cm, or
the film thickness Zt of the transparent electrode layer is smaller at the peripheral portion of the substrate as compared with the central portion thereof and the film thickness Zs of the photoelectric conversion unit is larger at the peripheral portion of the substrate as compared with the central portion thereof, and absolute values of ΔZt and ΔZs are more than 0.2%/cm.

3. The thin film photoelectric conversion device according to claim 1, wherein
the substrate is rectangular,
a film thickness Zta of the transparent electrode layer proximate at least one corner "a" of the substrate is larger than a film thickness Ztb of the transparent electrode layer proximate any other corner "b" of the substrate, and
a film thickness Zsa of the photoelectric conversion unit proximate the corner "a" is smaller than a film thickness Zsb of the photoelectric conversion unit-proximate the corner "b".

4. The thin film photoelectric conversion device according to claim 1, wherein a distribution of the film thickness of the transparent electrode layer and a distribution of the film thickness of the photoelectric conversion unit have an opposite thickness-distribution relation.

5. The thin film photoelectric conversion device according to claim 1, wherein
in the transparent electrode layer, a central portion of a film formation surface has a smaller thickness and a peripheral portion of the film formation surface has a larger thickness, and
in the photoelectric conversion unit, a central portion of a film formation surface has a larger thickness and a peripheral portion of the film formation surface has a smaller thickness.

6. The thin film photoelectric conversion device according to claim 1, wherein the photoelectric conversion unit is one or more selected from the group consisting of:
at least one amorphous photoelectric conversion unit;
at least one crystalline photoelectric conversion unit; and
a photoelectric conversion unit including both at least one amorphous photoelectric conversion unit and at least one crystalline photoelectric conversion unit.

7. The thin film photoelectric conversion device according to claim 1, wherein
the transparent electrode layer, the photoelectric conversion unit and the back electrode layer are divided by a plurality of separation grooves so as to form a plurality of photoelectric conversion cells, and
the plurality of photoelectric conversion cells are electrically connected in series with one another through a plurality of connection grooves.

8. The thin film photoelectric conversion device according to claim 7, wherein a direction in which the plurality of photoelectric conversion cells are connected in series is made substantially the same as a direction of the line segment X.

9. The thin film photoelectric conversion device according to claim 1, wherein an area of the substrate is not smaller than 900 cm$^2$.

10. A method for manufacturing the thin film photoelectric conversion device according to claim 1, the method at least comprising:

a step of separately forming a transparent electrode layer and a photoelectric conversion unit so that a film thickness distribution of the transparent electrode layer and a film thickness distribution of the photoelectric conversion unit have an opposite thickness- distribution relation to each other.

11. A method for manufacturing the thin film photoelectric conversion device according to claim 1, wherein
the transparent electrode layer is zinc oxide formed by a low-pressure thermal CVD method, and
as for temperatures of the substrate in forming the transparent electrode layer, a difference is made between a temperature of the central portion of the substrate and a temperature of the peripheral portion of the substrate.

* * * * *